United States Patent
Lee et al.

(10) Patent No.: US 12,340,844 B2
(45) Date of Patent: Jun. 24, 2025

(54) PHASE-CHANGE MEMORY CELL AND METHOD FOR FABRICATING THE SAME

(71) Applicant: TAIWAN SEMICONDUCTOR MANUFACTURING COMPANY, LTD., Hsinchu (TW)

(72) Inventors: Yung-Huei Lee, Hsinchu (TW); Chun-Wei Chang, Hsinchu (TW); Jian-Hong Lin, Hsinchu (TW); Wen-Hsien Kuo, Hsinchu (TW); Pei-Chun Liao, Hsinchu (TW); Chih-Hung Nien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/632,583

(22) Filed: Apr. 11, 2024

(65) Prior Publication Data

US 2024/0257871 A1 Aug. 1, 2024

Related U.S. Application Data

(63) Continuation of application No. 17/581,351, filed on Jan. 21, 2022, now Pat. No. 11,978,511.

(60) Provisional application No. 63/225,195, filed on Jul. 23, 2021.

(51) Int. Cl.
*G11C 13/00* (2006.01)
*G11C 11/56* (2006.01)

(52) U.S. Cl.
CPC ...... *G11C 13/0069* (2013.01); *G11C 11/5678* (2013.01); *G11C 13/0004* (2013.01); *G11C 2013/0092* (2013.01)

(58) Field of Classification Search
CPC ............ G11C 13/0069; G11C 11/5678; G11C 13/0004; G11C 2013/0092; G11C 13/004; G11C 13/0064; H10B 63/10; H10N 70/8828
See application file for complete search history.

(56) References Cited

U.S. PATENT DOCUMENTS

| | | | |
|---|---|---|---|
| 9,324,428 B1 | 4/2016 | Chien et al. | |
| 9,558,823 B1* | 1/2017 | Khwa | G11C 13/0069 |
| 11,978,511 B2* | 5/2024 | Lee | H10B 63/10 |
| 2006/0151849 A1* | 7/2006 | Czubatyj | H10N 70/8828 438/54 |

(Continued)

*Primary Examiner* — Jay W. Radke
(74) *Attorney, Agent, or Firm* — Birch, Stewart, Kolasch & Birch, LLP

(57) ABSTRACT

A phase-change memory (PCM) cell is provided to include a first electrode, a second electrode, and a phase-change feature disposed between the first electrode and the second electrode. The phase-change feature is configured to change its data state based on a write operation performed on the PCM cell. The write operation includes a reset stage and a set stage. In the reset stage, a plurality of reset current pulses are applied to the PCM cell, and the reset current pulses have increasing current amplitudes. In the set stage, a plurality of set current pulses are applied to the PCM cell, and the set current pulses exhibit an increasing trend in current amplitude. The current amplitudes of the set current pulses are smaller than those of the reset current pulses.

20 Claims, 21 Drawing Sheets

(56) References Cited

U.S. PATENT DOCUMENTS

2006/0220071 A1* 10/2006 Kang ................ G11C 13/0004
                                                                    257/248
2006/0221679 A1   10/2006 Kang et al.
2008/0219046 A1    9/2008 Chen et al.
2010/0027328 A1*  2/2010 Czubatyj ................ G11C 11/56
                                                                    365/163

* cited by examiner (a)

(b)

PHASE-CHANGE MEMORY CELL AND METHOD FOR FABRICATING THE SAME

PRIORITY CLAIM AND CROSS-REFERENCE

This application is a continuation of U.S. patent application Ser. No. 17/581,351, which was filed on Jan. 21, 2022, and which claims priority of U.S. Provisional Patent Application No. 63/225,195, filed on Jul. 23, 2021.

BACKGROUND

Phase-change memory (PCM) is a candidate for next generation memories. A PCM cell is operable to switch between an amorphous state and a crystalline state. In general, the PCM cell has a high electrical resistance in the amorphous state, and has a low electric resistance in the crystalline state, which can be used for data storage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
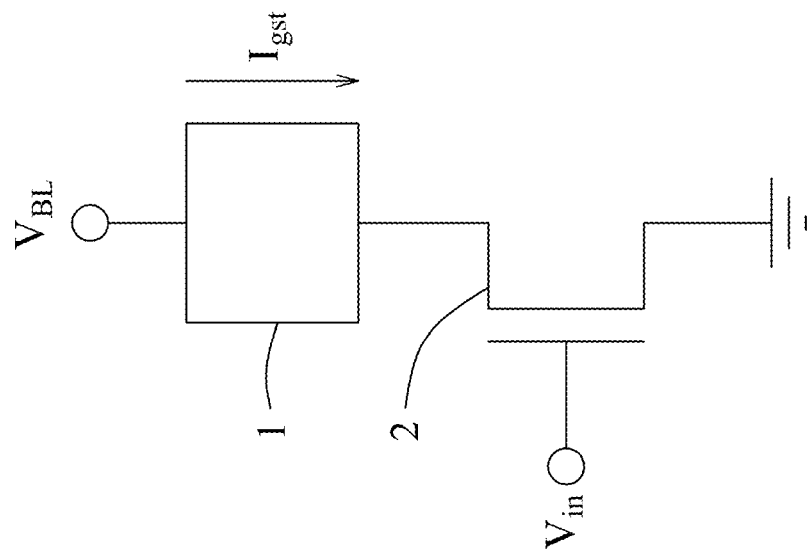
FIG. 2 is a circuit schematic diagram illustrating a circuit to perform read/write operation on the PCM cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "up," "down," on, "above," "over," "under," "beneath," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
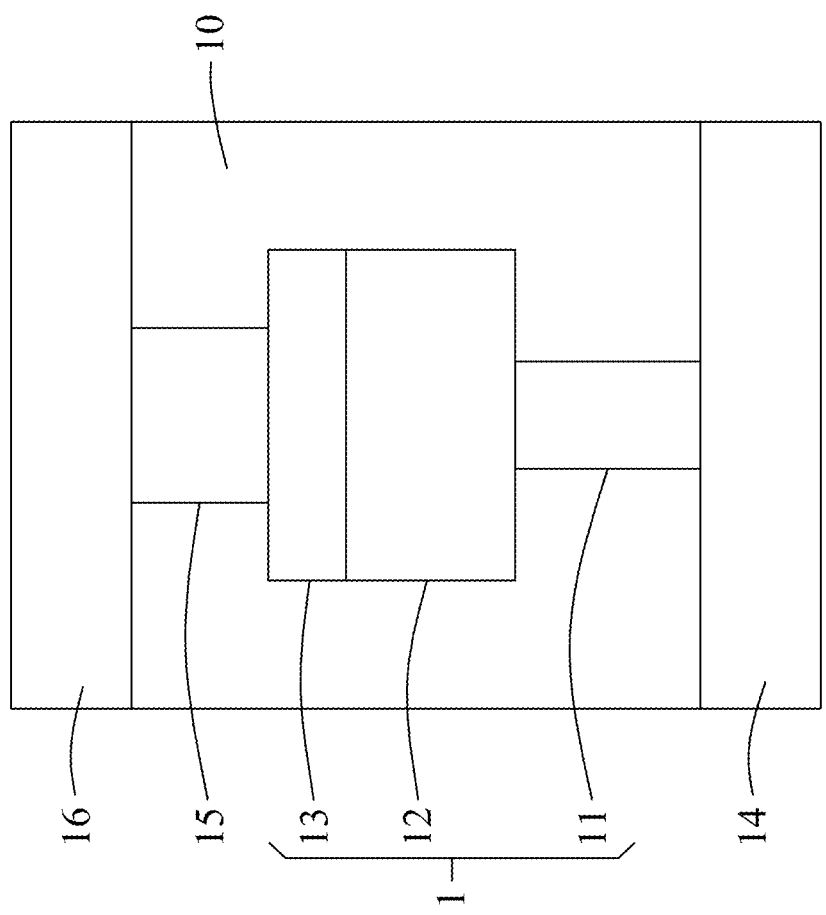
FIG. 1 is a schematic view illustrating a structure of a phase-change memory (PCM) cell in accordance with some embodiments.

FIG. 1 illustrates a PCM cell 1 in accordance with some embodiments. The PCM cell 1 is formed in a dielectric feature 10, and includes a bottom electrode 11, a phase-change feature 12 formed over the bottom electrode 11, and a top electrode 13 formed over the phase-change feature 12. The phase-change feature 12 is sandwiched between the bottom electrode 11 and the top electrode 13, and is made of a chalcogenide alloy of germanium, antimony and tellurium (GeSbTe) called GST in the illustrative embodiment. Particularly, the phase-change feature 12 is a GST feature made of GST-225 ($Ge_2Sb_2Te_5$) in the illustrative embodiment due to its good endurance and material stability, and is referred to as the GST feature 12 hereinafter. In other embodiments, the phase-change feature 12 may be made of GST with other compositions (e.g., GeTe, $Ge_8Te_2Te_{11}$, $Ge_6Sb_2Te_9$, $Sb_2Te_3$), other suitable materials, or any combination of GST-225, GST with other compositions and/or other suitable materials, and this disclosure is not limited in this respect. In some embodiments, the phase-change feature 12 may be doped using, for example but not limited to, C, O, N, Ni, Al, Ti, etc. The GST feature 12 is usually made to have a stable hexagonal crystalline structure. The bottom electrode 11 may be made of, for example but not limited to, TiN, TaN, Cu, other suitable conductive materials, or any combination thereof. The top electrode 13 may be made of, for example but not limited to, TiN, TaN, Cu, other suitable conductive materials, or any combination thereof. In the illustrative embodiment, the bottom electrode 11 is made smaller than the top electrode 13 in width, so as to induce a higher current density at a lower portion of the GST feature 12 when current flows through the PCM cell 1. The bottom electrode 11 is electrically connected to a first metal layer 14. A top electrode via 15 is formed over the top electrode 13 for connecting the top electrode 13 to a second metal layer 16. The dielectric feature 10 may be made of, for example but not limited to, phosphosilicate glass (PSG), borophosphosilicate glass (BPSG), fluorosilicate glass (FSG), $SiO_xC_y$, Spin-On-Glass, Spin-On-Polymers, silicon carbon material, low-k materials, other suitable materials, or any combination thereof. Each of the first metal layer 14 and the second metal layer 16 may be made of, for example but not limited to, TiN, TaN, Cu, other suitable conductive materials, or any combination thereof.

FIG. 2 illustrates a circuit to perform read/write operation on the PCM cell 1 in accordance with some embodiments. The PCM cell 1 is connected between a transistor 2 (e.g., a metal-oxide-semiconductor field-effect transistor, MOSFET) and a voltage source (not shown) providing a bit-line voltage $V_{BL}$. A control terminal (e.g., gate) of the transistor 2 is disposed to receive an input voltage $V_{in}$ that is used to control a current $I_{gst}$ flowing through the PCM cell 1 (referred to as a cell current hereinafter). In general, the higher the input voltage $V_{in}$, the greater the cell current $I_{gst}$.

Figure 3:
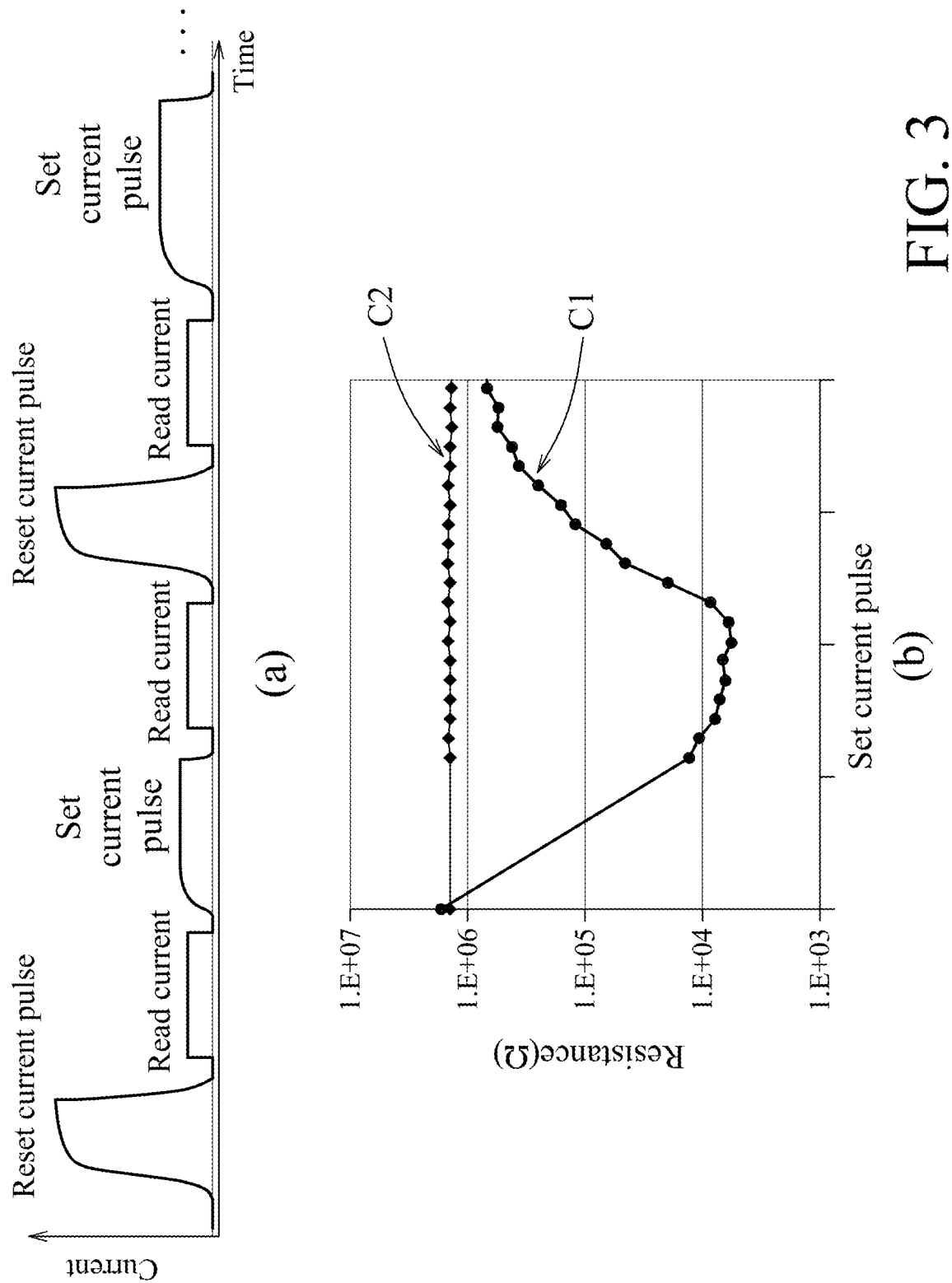
FIG. 3 shows a waveform diagram and a plot that illustrate a method to determine a current amplitude of current pulses to turn the PCM cell from a high-resistance data state into a low-resistance data state in accordance with some embodiments.

Further referring to FIG. 3, part (a) is a waveform diagram that illustrates a method to determine a current amplitude of current pulses to turn the PCM cell 1 (or to be specific, the GST feature 12 of the PCM cell 1) from a high-resistance data state (state-0) into a low-resistance data state (state-1) in accordance with some embodiments. In the waveform diagram, a reset current pulse followed by a set current pulse cooperatively constitute a test cycle. The reset current pulse provides a great cell current $I_{gst}$ with a short pulse width to quickly heat and quench the GST feature 12, making the GST feature 12 amorphous. After the reset current pulse, the set current pulse is provided to generate a relatively small cell current $I_{gst}$ with a relatively long pulse width, holding the PCM cell 1 in its crystallization temperature range sufficiently long to switch the PCM cell 1 from state-0 to state-1. The current amplitude of the set current pulse in a later write operation is slightly greater than that in an earlier write operation, so as to collect resistance values resulting from previous set current pulse(s) of different current amplitude(s). Each of the reset current pulses and the set current pulses is followed by a read operation that generates a read current for measuring an electrical resistance of the GST feature 12 of the PCM cell 1 (referred to as cell resistance of the PCM cell 1 hereinafter) resulting from the reset/set current pulse. In part (b) of FIG. 3, data points that form a curve C1 represent the cell resistances each being measured after a respective one of the set current pulses is applied, and data points that form a curve C2 respectively correspond to the data points of the curve C1. Each of the data points of the curve C2 represents the cell resistance measured after a respective reset current pulse that is applied before the corresponding set current pulse (i.e., the set current pulse that cooperates with the reset current pulse to constitute a test cycle). The current amplitude used to turn the PCM cell 1 from state-0 to state-1 is usually selected as one of those corresponding to the lowest portion of the curve C1. In this example, state-0 may be set to correspond to cell resistance of about 1 MΩ or greater, and state-1 (low resistance state) may be set to correspond to cell resistance of between about 1 kΩ and about 10 kΩ.

Figure 4:
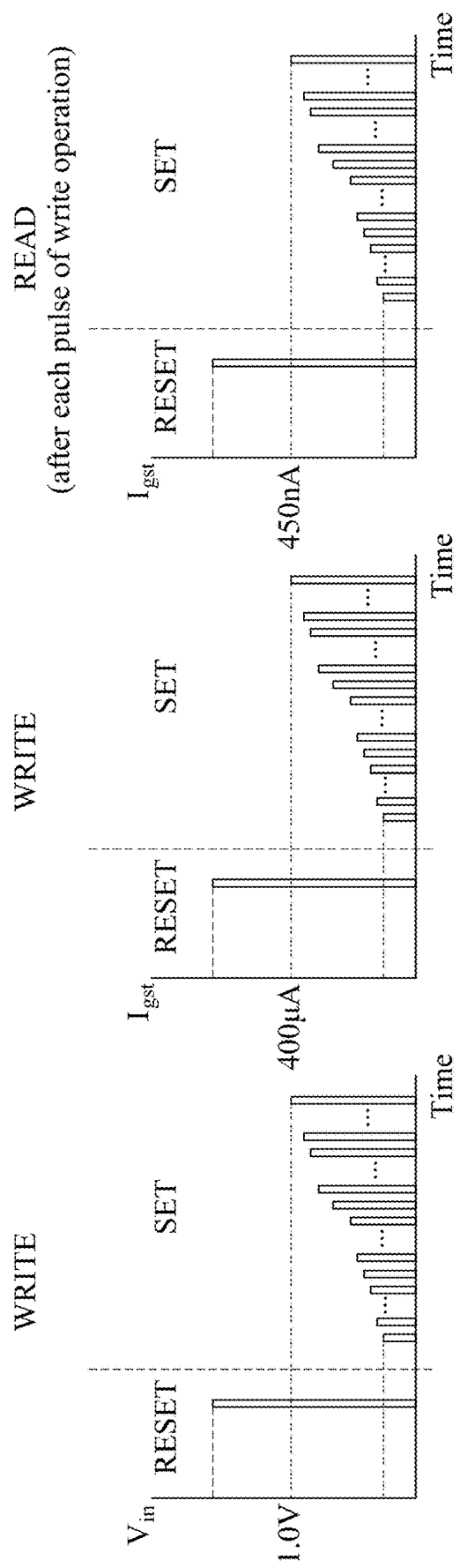
FIG. 4 is a waveform diagram illustrating a method for writing data into the PCM cell in accordance with some embodiments, where a fixed-width step-pulse set is applied to the PCM cell after a single-shot reset.
Figure 5:
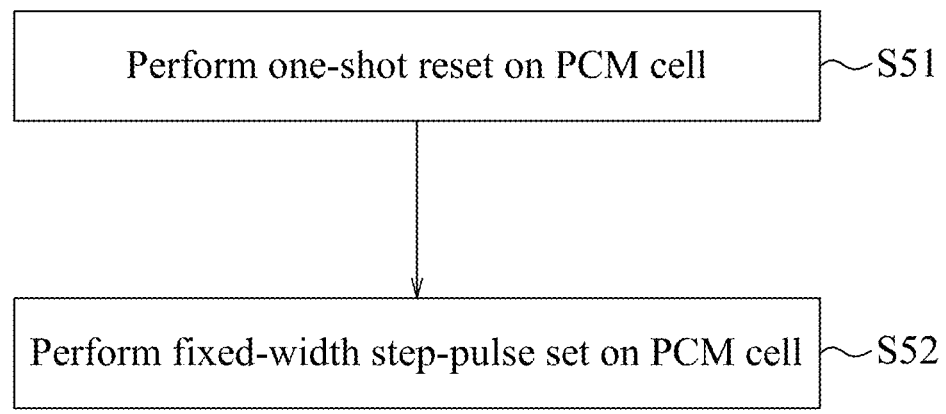
FIG. 5 is a flow chart illustrating steps of a method for writing data into the PCM cell in accordance with some embodiments, where the fixed-width step-pulse set is applied to the PCM cell after a single-shot reset.

FIG. 4 shows some waveform diagrams related to performing a write operation on the PCM cell 1 (see FIG. 2) in accordance with some embodiments. The left plot shows the input voltage $V_{in}$ used to perform the write operation on the PCM cell 1, the middle plot shows the cell current $I_{gst}$ resulting from the input voltage $V_{in}$ as shown in the left plot, and the right plot shows the cell current $I_{gst}$ obtained in read operations, each being performed after a respective pulse for the write operation. For example, the first pulse in the left plot is a reset voltage pulse, which would result in a reset current pulse (i.e., the first pulse in the middle plot) and, after the reset voltage pulse, a read voltage pulse (not shown), which is usually much smaller than the reset voltage pulse, is applied to obtain a read current pulse that is the first pulse in the right plot. The other pulses in the right plot are obtained in a similar manner with respect to the respective set current pulses. The read current pulses can be used to calculate the resistances of the PCM cell 1.

Referring to FIGS. 1, 2, 4 and 5, in accordance with some embodiments, a method for writing data into the PCM cell 1 is shown to include a reset stage ("RESET", where a pre-conditioning reset operation is performed) and a set stage ("SET", where a set operation is performed) that follows the reset stage. In the reset stage, a single reset current pulse is applied to the GST feature 12 through the bottom electrode 11 and the top electrode 13, and this type of reset stage is called "one-shot reset" (step S51). In the set stage, multiple set current pulses are applied to the GST feature 12 through the bottom electrode 11 and the top electrode 13 (step S52). The set current pulses demonstrate a gradual increase in current amplitude (i.e., for two consecutive set current pulses, the later set current pulse may have the same or a slightly greater current amplitude in comparison to the earlier set current pulse, and the set current pulses as a whole have an increasing trend in current amplitude), and have a fixed pulse width, and this type of set stage is called "fixed-width step-pulse set". In the illustrative embodiment, for two consecutive set current pulses, the later one has a slightly greater current amplitude. The greater set current pulse may cause more crystallization in the GST feature 12, resulting in a lower cell resistance. It is noted that the set current pulses usually have a smaller current amplitude and a greater pulse width in comparison to the reset current pulse, so as to enable crystallization of the GST feature 12. The current amplitudes and the pulse widths of the reset and set current pulses may depend on the structure and the material of the PCM cell 1, which should be familiar to those skilled in the art, so details thereof are omitted herein for the sake of brevity. In the right plot of FIG. 4, the increasing read current pulses at the set stage show a trend that the resistance of the PCM cell 1 decreases with the increasing set current pulses shown in the middle plot of FIG. 4.

Figure 6:
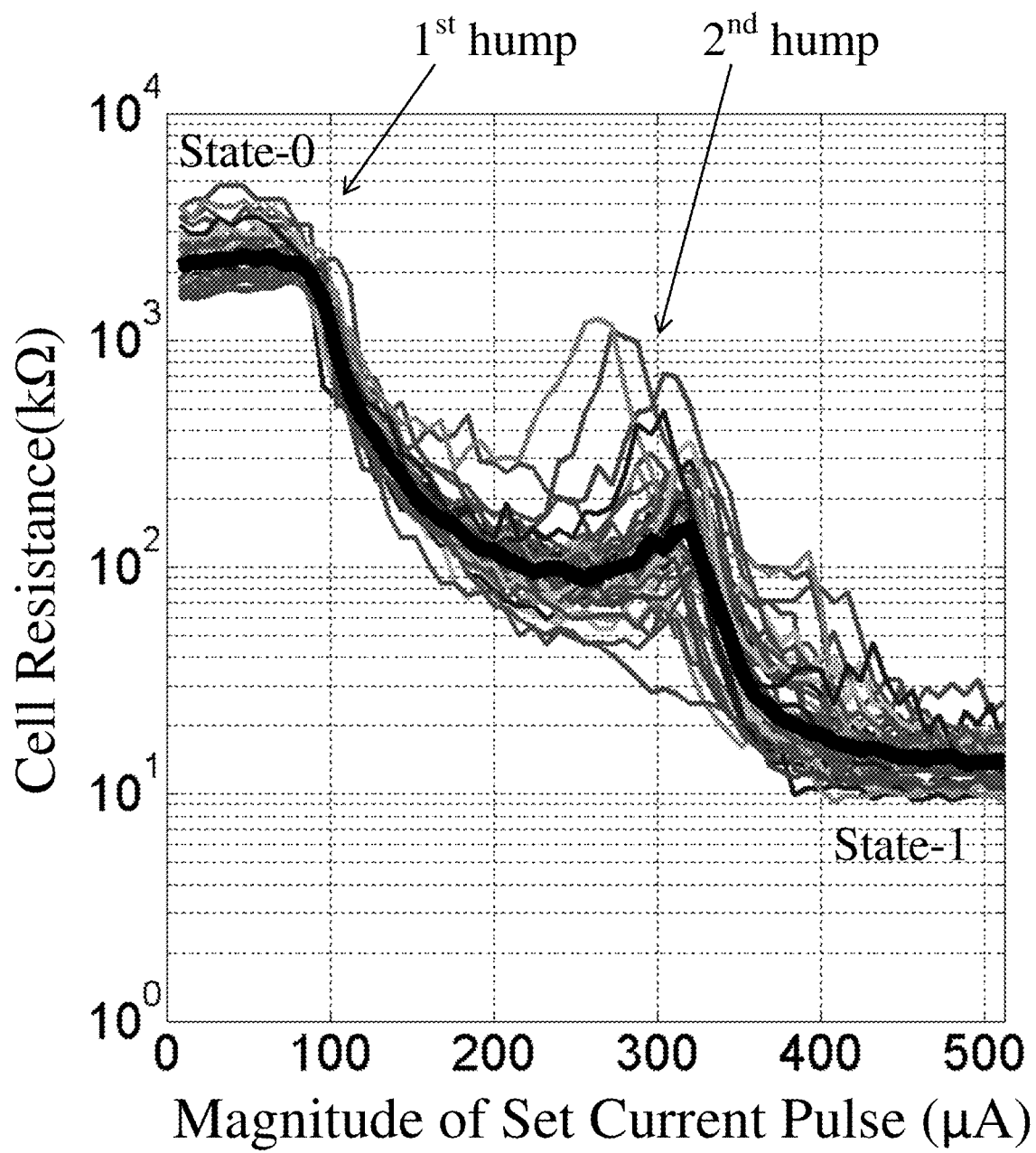
FIG. 6 is a plot illustrating a relationship between a cell resistance of the PCM cell and current amplitudes of set current pulses applied to the PCM cell in accordance with some embodiments, where the fixed-width step-pulse set is applied to the PCM cell after a single-shot reset.

FIG. 6 illustrates variation of the cell resistance with the increasing set current pulses by use of the aforesaid operation scenario (i.e., one-shot reset+fixed-width step-pulse set, as shown in FIG. 4). Curves in FIG. 6 correspond to multiple PCM cells and show that the cell resistance tends to decrease with the increasing set current pulses but has a second hump in a middle part of the curves; this is called "double hump" phenomenon. The second hump refers to that the cell resistance rises for about an order (e.g., ten times) on the way of decreasing from the high-resistance data state (e.g., about $10^3$ kΩ in FIG. 6) to the low-resistance data state (e.g., about 10 kΩ in FIG. 6). Although the double hump phenomenon may not affect operation of the PCM cell 1 when the PCM cell 1 is used in a single-level cell (SLC) application, such phenomenon is not favorable when the PCM cell 1 is to be used in a multi-level cell (MLC) application, where at least four data states are required to be defined for a single PCM cell 1 for storing more than one bit of data in the PCM cell 1.

Figure 7:
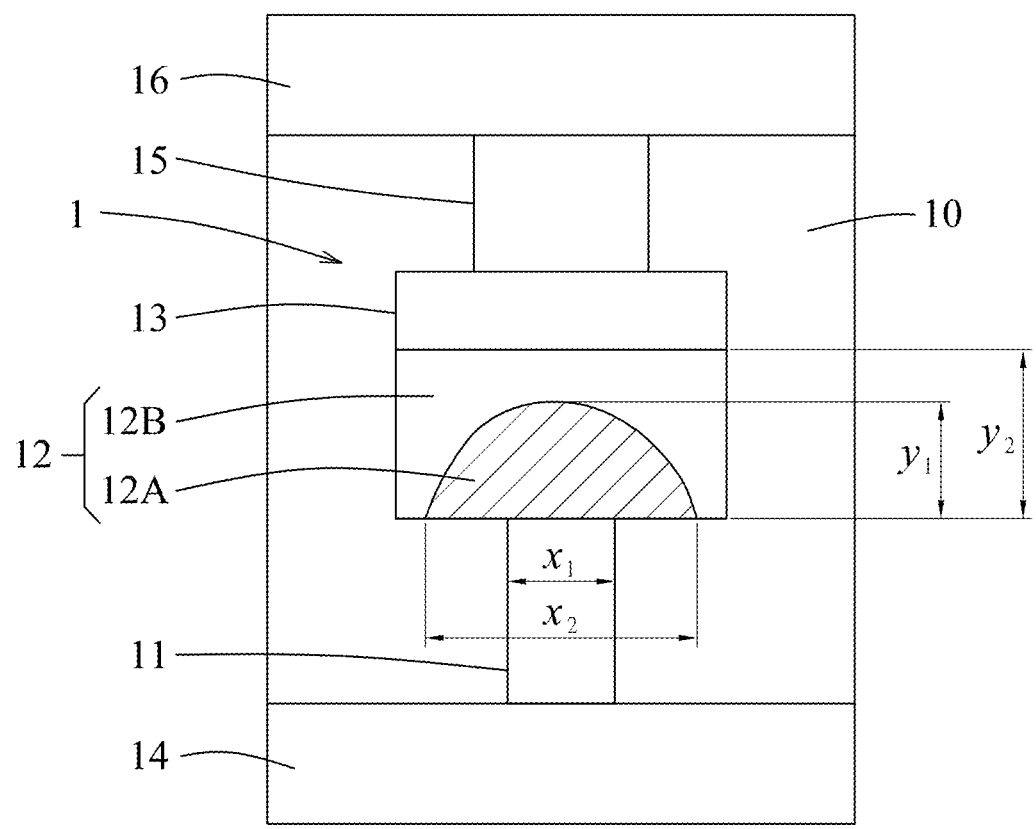
FIG. 7 is a schematic view illustrating a structure of the PCM cell that is in the high-resistance data state in accordance with some embodiments, where the single-shot reset is applied to the PCM cell.

FIG. 7 illustrates the GST feature 12 after the one-shot reset. The one-shot reset causes a part of the GST feature 12 that is adjacent to the bottom electrode 11 to turn into a high-resistivity state. In this disclosure, when a region is described to be in the high-resistivity state, it means that a percentage of amorphous microstructure is greater than a percentage of crystalline microstructure in that region, which results in high electrical resistivity of the region. This part of the GST feature 12 is referred to as an active region 12A hereinafter. The active region 12A is usually shaped as a dome. It is noted that the dimension and microstructure related to the GST feature 12 may be identified using transmission electron microscopy (TEM) or scanning transmission electron microscopy (STEM), and the microstructure of the GST feature 12 may be analyzed using nanobeam precision electron diffraction (PED) combined with STEM. According to data collected from multiple PCM cells 1 in the illustrative embodiment, a common phenomenon is observed that more than 80% (i.e., from 80% to 100%) of the active region 12A is amorphous or short-range ordering (namely, less than 20% (from 20% to 0%) of the active region 12A is crystalized) after the one-shot reset (i.e., the active region 12A is in the high-resistivity state). On the other hand, the remaining region of the GST feature 12 (i.e., other than the active region 12A), which is referred to as an inactive region 12B hereinafter, is in a low-resistivity state. In this disclosure, when a region is described to be in the low-resistivity state, it means that a percentage of crystalline microstructure is greater than a percentage of amorphous microstructure in that region, resulting in low electrical resistivity (compared to the high-resistivity state) of the region. According to the data collected from multiple PCM cells 1 in the illustrative embodiment, a common phenomenon is observed that more than 80% of the inactive region 12B has a hexagonal crystal structure. It is also observed that a ratio of a width ($x_2$) of the active region 12A to a width ($x_1$) of the bottom electrode 11 is commonly in a range from about 1.0 to about 2.0 (i.e., $1.0 \leq x_2/x_1 \leq 2.0$), and a ratio of a height ($y_1$) of the active region 12A to a height ($y_2$) of the GST feature 12 is commonly in a range from about 0.8 to about 1.0 (i.e., $0.8 \leq y_1/y_2 \leq 1.0$).

Figure 8:
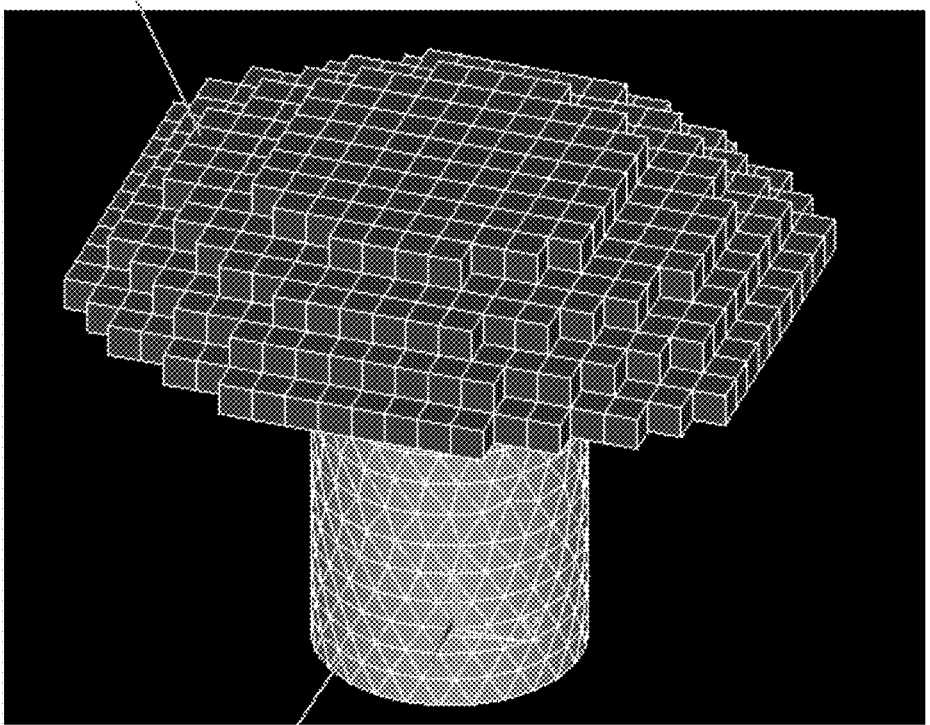
FIG. 8 shows some simulation results of the structure of the PCM cell that is in the high-resistance data state after the single-shot reset, and current densities within the PCM cell during the single-shot reset.
Figure 8:
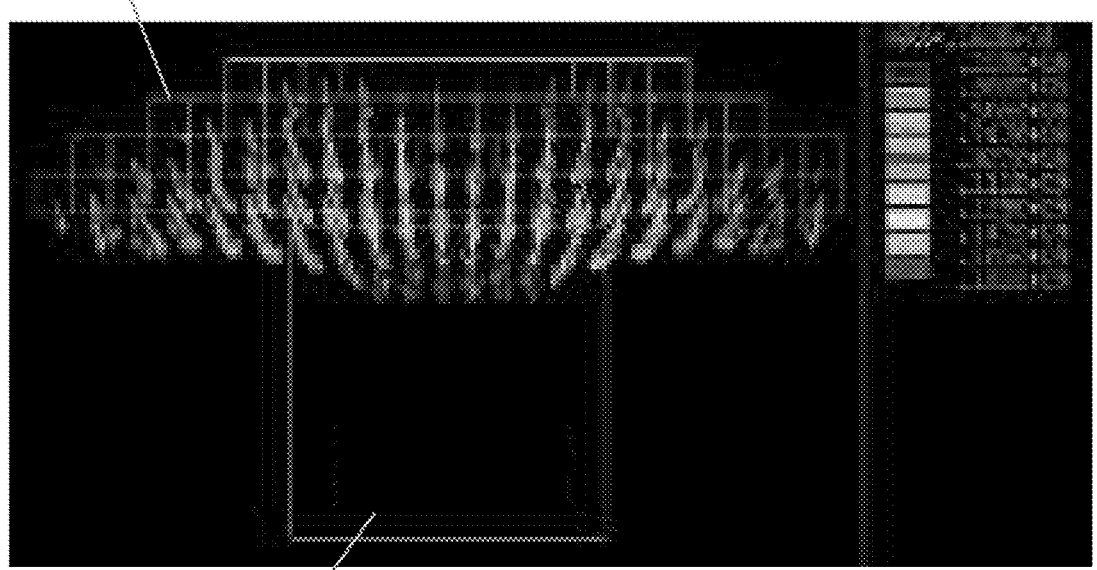

FIG. 8 shows a simulation result of the dome-shaped active region 12A (see part (a)) and a simulation result of the current density (see part (b)) within the GST feature 12 after the one-shot reset. The simulation results are obtained using a finite element method (FEM). It can be observed that formation of the amorphous microstructure in the active region 12A is correlated to the current density in the GST feature 12 when the reset current pulse is applied. In other words, the size and shape of the active region 12A can be controlled by regulating the reset current pulse.

Figure 9:
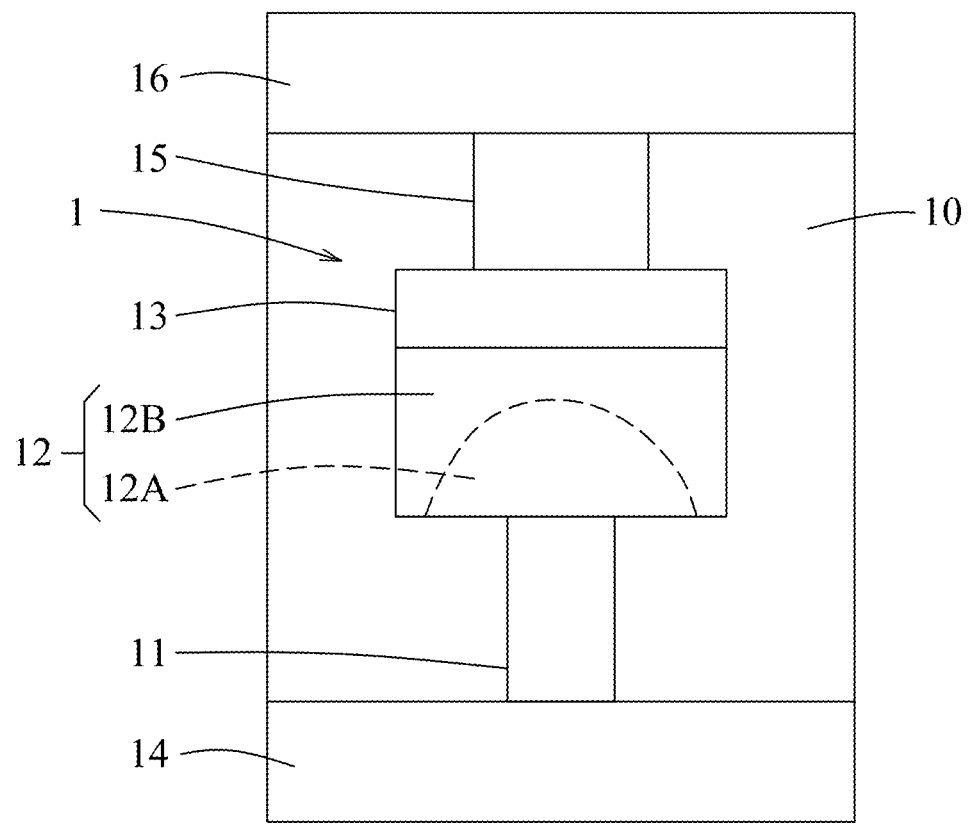
FIG. 9 is a schematic view illustrating a structure of the PCM cell that is in the low-resistance data state in accordance with some embodiments, where the fixed-width step-pulse set is applied to the PCM cell after the single-shot reset.

FIG. 9 illustrates the GST feature 12 after the fixed-width step-pulse set that follows the one-shot reset. The fixed-width step-pulse set transforms the active region 12A of the GST feature 12 from the high-resistivity state into the low-resistivity state. According to the data collected from multiple PCM cells 1 in the illustrative embodiment, a common phenomenon is observed that more than 80% of the active region 12A is crystalized area when the active region 12A has been transformed into the low-resistivity state, and a major phase of the crystalized area is a cubic phase (i.e., crystalized in a cubic crystal structure, such as face-centered cubic packing (FCC)), usually occupying more than 60% (i.e., from 60% to 100%) of the crystalized area (i.e., more than 60% of the crystalline microstructure in the active region 12A has the cubic crystal structure). For GST-225, the cubic phase is less stable than the hexagonal phase, and may thus induce the "double hump" phenomenon.

Referring to FIGS. 1, 2, 10 and 11, in accordance with some embodiments, a method for writing data into the PCM cell 1 is shown to include a reset stage ("RESET") and a set stage ("SET") that follows the reset stage. In the reset stage, multiple reset current pulses are applied to the GST feature 12 through the bottom electrode 11 and the top electrode 13 (step S111). The reset current pulses demonstrate a gradual increase in current amplitude (i.e., for two consecutive reset current pulses, the later reset current pulse may have the same or a slightly greater current amplitude in comparison to the earlier reset current pulse, and the reset current pulses as a whole have an increasing trend in current amplitude), and have a fixed pulse width, so this type of reset stage is called "fixed-width step-pulse reset". In the illustrative embodiment, for two consecutive reset current pulses, the later one has a slightly greater current amplitude. The pulse width of the reset current pulses may range from about 5 ns to about 100 ns, and a pulse interval between two consecutive reset current pulses may range from about 5 ns to about 200 ns. A time period of the reset stage (e.g., between the first reset current pulse and the last reset current pulse) may range from about 2 μs to about 50 μs. Greater reset current pulse may create more amorphous microstructure in the GST feature 12, resulting in a higher cell resistance. If energy applied to the GST feature 12 at the reset stage is insufficient (e.g., resulting from an insufficient pulse width, excessively long pulse interval(s), and/or an insufficient time period of the reset stage), the PCM cell 1 may not be effectively turned into the high-resistance data state. If energy applied to the GST feature 12 at the reset stage is excessively large (e.g., resulting from an excessively long pulse width, insufficient pulse interval(s), and/or an excessively long time period of the reset stage), the GST feature 12 may be damaged, resulting in degradation of the PCM cell 1. In the set stage, the fixed-width step-pulse set as described for FIG. 4 is applied to the PCM cell 1 (step S112). In the illustrative embodiment, the pulse width of the set current pulses may range from about 50 ns to about 500 ns, and a pulse interval between two consecutive set current pulses may range from about 50 ns to about 500 ns. A time period of the set stage (e.g., between the first set current pulse and the last set current pulse) may range from about 20 μs to about 2000 μs. It is noted that the set current pulses usually have smaller current amplitudes and greater pulse widths in comparison to the reset current pulses, so as to enable crystallization of the GST structure 12. If energy applied to the GST feature 12 at the set stage is insufficient (e.g., resulting from an insufficient pulse width, excessively long pulse interval(s), and/or an insufficient time period of the set stage), the amorphous portion of the GST feature 12 may not be effectively crystalized.

If energy applied to the GST feature 12 at the set stage is excessively large (e.g., resulting from an excessively long pulse width, insufficient pulse interval(s), and/or an excessively long time period of the set stage), time required for the write operation may be too long, resulting in poor operation efficiency. The current amplitudes and the pulse widths of the reset and set current pulses may depend on the structure and the material of the PCM cell 1, which should be familiar to those skilled in the art, so details thereof are omitted herein for the sake of brevity. In the right plot of FIG. 10, the decreasing read current pulses at the reset stage show a trend that the resistance of the PCM cell 1 increases with the increasing reset current pulses (see the middle plot of FIG. 10), and the increasing read current pulses at the set stage show a trend that the resistance of the PCM cell 1 decreases with the increasing set current pulses (see the middle plot of FIG. 10).

Figure 10:
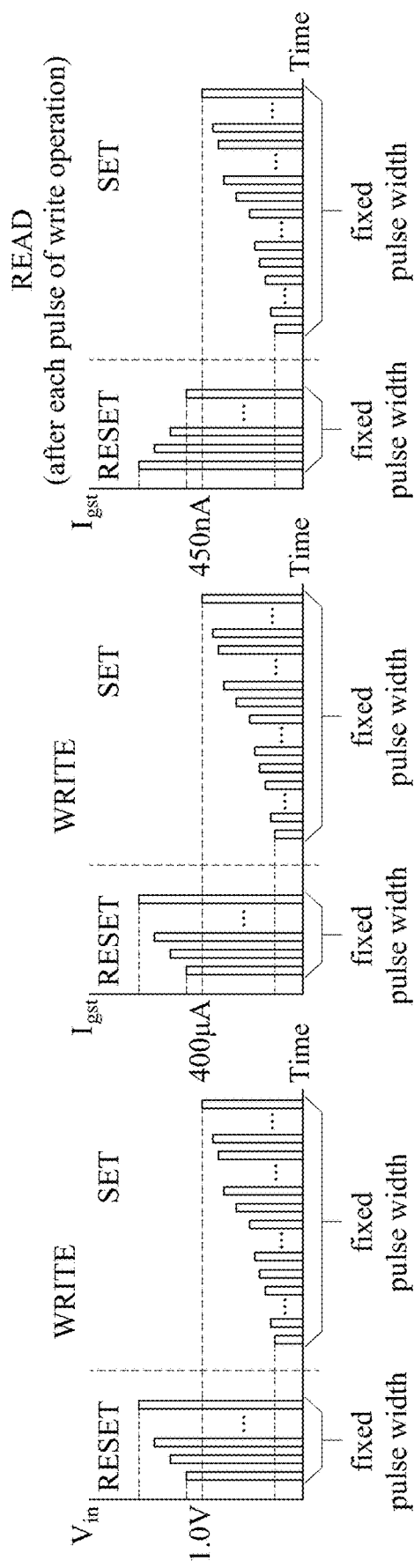
FIG. 10 is a waveform diagram illustrating a method for writing data into the PCM cell in accordance with some embodiments, where a fixed-width step-pulse set is applied to the PCM cell after a fixed-width step-pulse reset.
Figure 11:
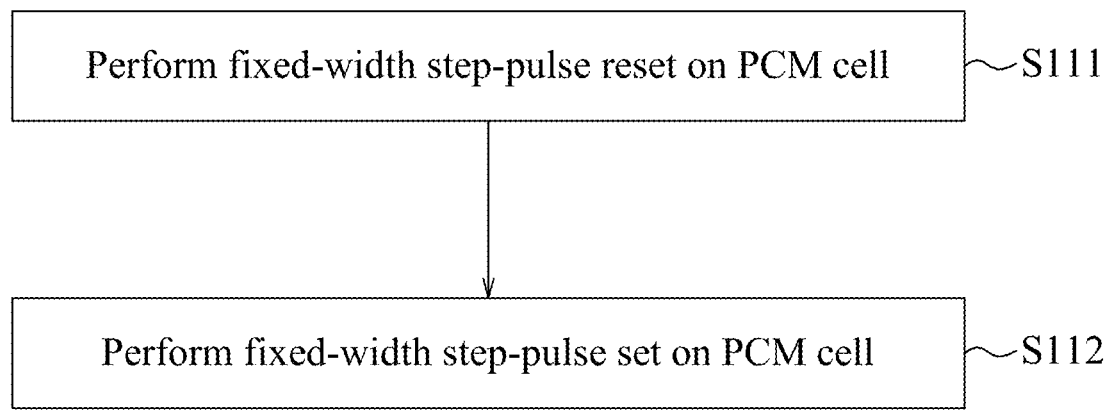
FIG. 11 is a flow chart illustrating steps of a method for writing data into the PCM cell in accordance with some embodiments, where the fixed-width step-pulse set is applied to the PCM cell after the fixed-width step-pulse reset.
Figure 12:
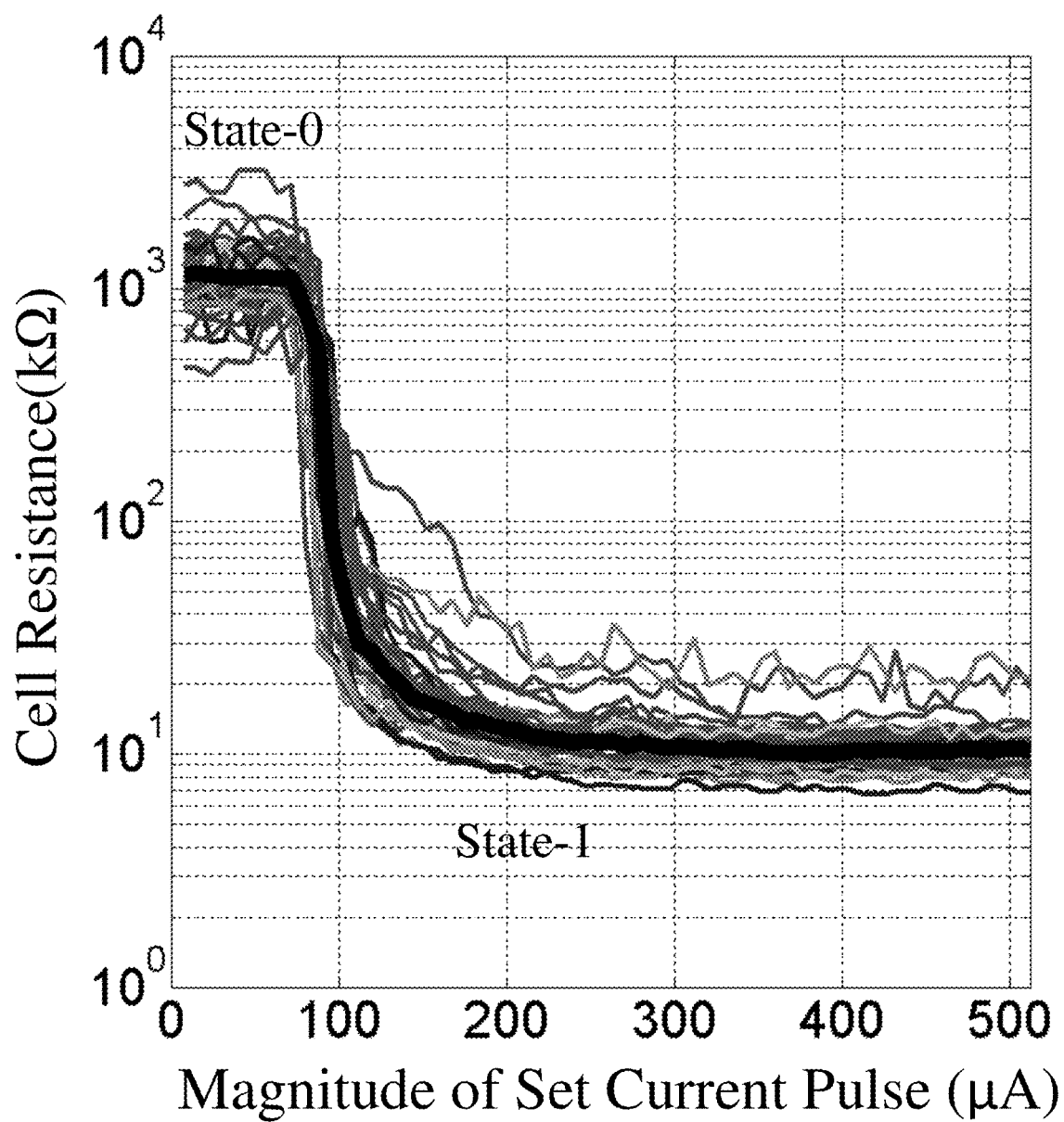
FIG. 12 is a plot illustrating a relationship between a cell resistance of the PCM cell and current amplitudes of set current pulses applied to the PCM cell in accordance with some embodiments, where the fixed-width step-pulse set is applied to the PCM cell after the fixed-width step-pulse reset.

FIG. 12 illustrates variation of the cell resistance with the increasing set current pulses by use of the aforesaid operation scenario (i.e., fixed-width step-pulse reset+fixed-width step-pulse set, as shown in FIG. 10). Curves in FIG. 12 correspond to multiple PCM cells and show that the cell resistance tends to decrease with the increasing set current pulses, and the double hump phenomenon is absent. However, the slope sections of the curves from state-0 to state-1 are steep, which may not be favorable for MLC application. For each curve, the slope section thereof may be approximated using an equation of: $R_{SET} = C_0 \times I_{SET}^{-n} + C_1$, where $I_{SET}$ represents the current amplitude of the set current pulse in μA, $R_{SET}$ represents the cell resistance in kΩ, which results from the set current pulses, $C_0$ and $C_1$ are constants, and n represents a slope of the slope section. If the slope n is too large, the rapid drop of the cell resistance may make it difficult to control the set current pulses for obtaining more data states of which the cell resistances are between those of state-0 and state-1. On the other hand, a small slope n may make current amplitude for turning the PCM cell into state-1 higher, which is more power consuming. According to experiments, it is observed that, when the slope n is in a range from about two to about five (2≤n≤5), a good balance is made between power consumption and set current pulse control, and such a slope n is thus suitable for MLC application. In FIG. 12, the slopes of the curves are about 10, which may be too steep for MLC application.

Figure 13:
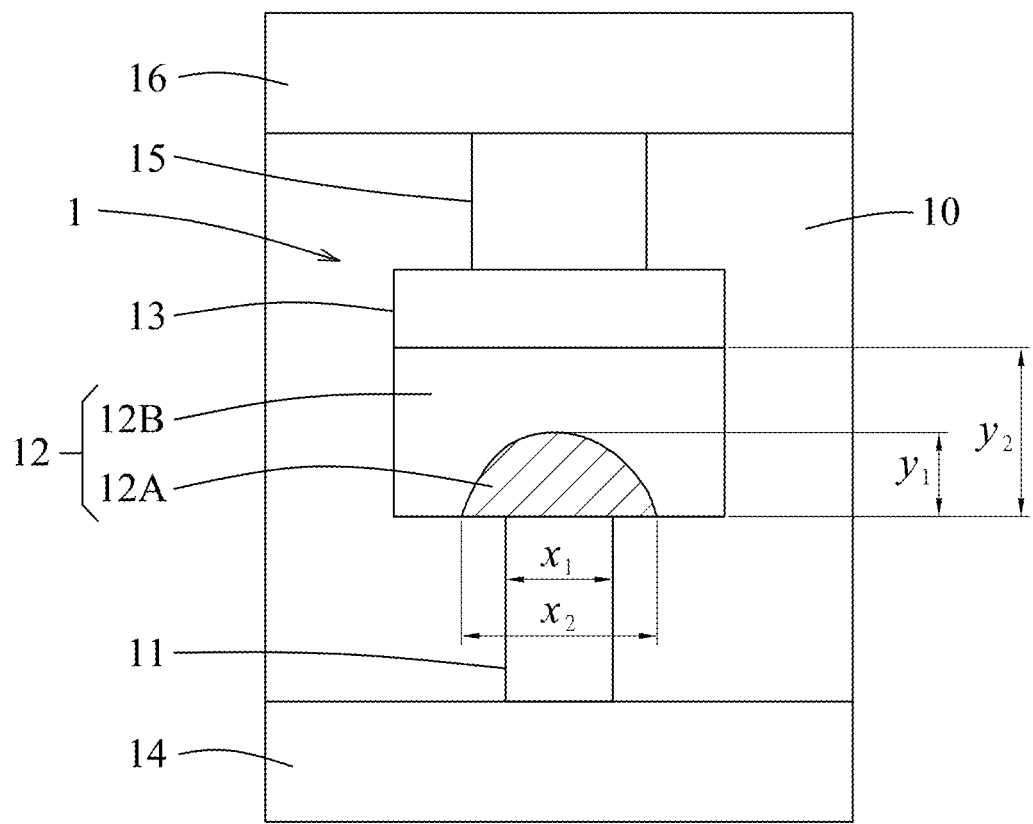
FIG. 13 is a schematic view illustrating a structure of the PCM cell that is in the high-resistance data state in accordance with some embodiments, where the fixed-width step-pulse reset is applied to the PCM cell.
Figure 14:
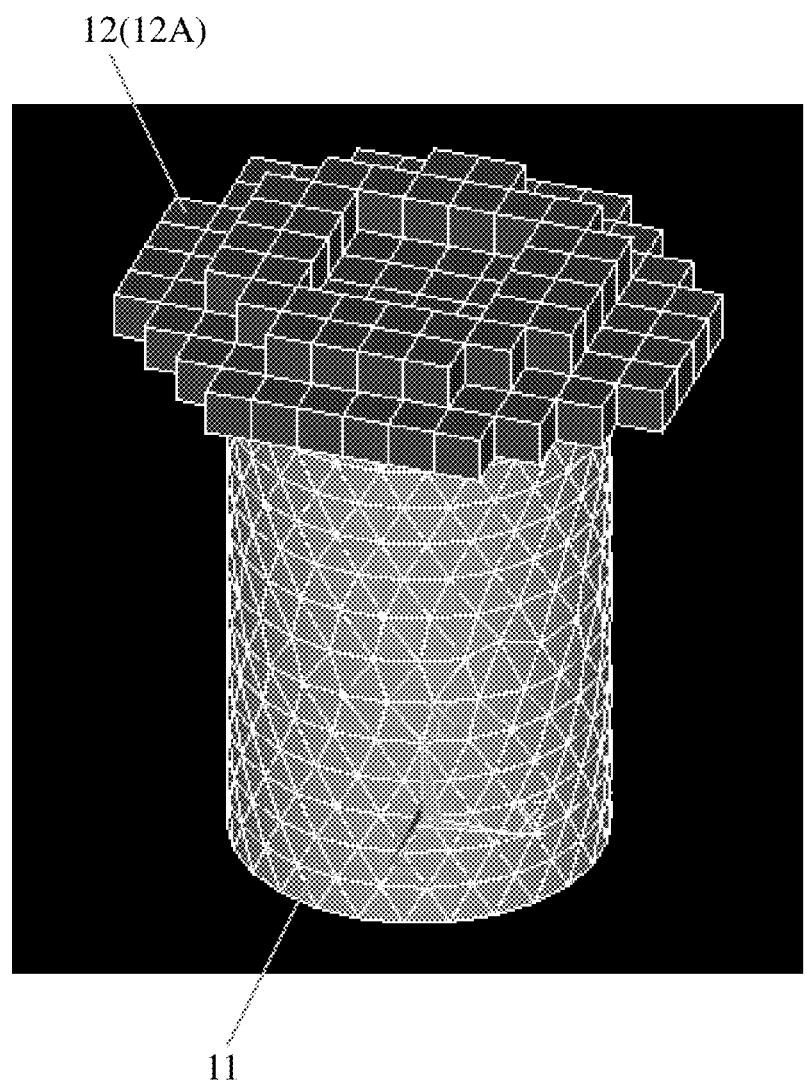
FIG. 14 shows some simulation results of the structure of the PCM cell that is in the high-resistance data state after the fixed-width step-pulse reset.

FIG. 13 illustrates the GST feature 12 after the fixed-width step-pulse reset. The fixed-width step-pulse reset transforms the active region 12A of the GST feature 12 into the high-resistivity state. According to data collected from multiple PCM cells 1 in the illustrative embodiment, a common phenomenon is observed that more than 80% of the active region 12A is amorphous or short-range ordering (i.e., less than 20% of the active region 12A is crystalized) when the active region 12A is in the high-resistivity state, and more than 80% of the inactive region 12B has a hexagonal crystal structure. It is also observed that the ratio $x_2/x_1$ is commonly in a range from about 0.5 to about 2.0, and the ratio $y_1/y_2$ is commonly in a range from about 0.2 to about 0.8. In general, the active region 12A induced by the fixed-width step-pulse reset has a smaller width and a smaller height in comparison to that induced by the one-shot reset. Referring to FIG. 14, the FEM simulation result also shows that the active region 12A induced by the fixed-width step-pulse reset may have a relatively small volume and a relatively irregular shape in comparison to the active region 12A induced by the one-shot reset, as shown in FIG. 8.

Figure 15:
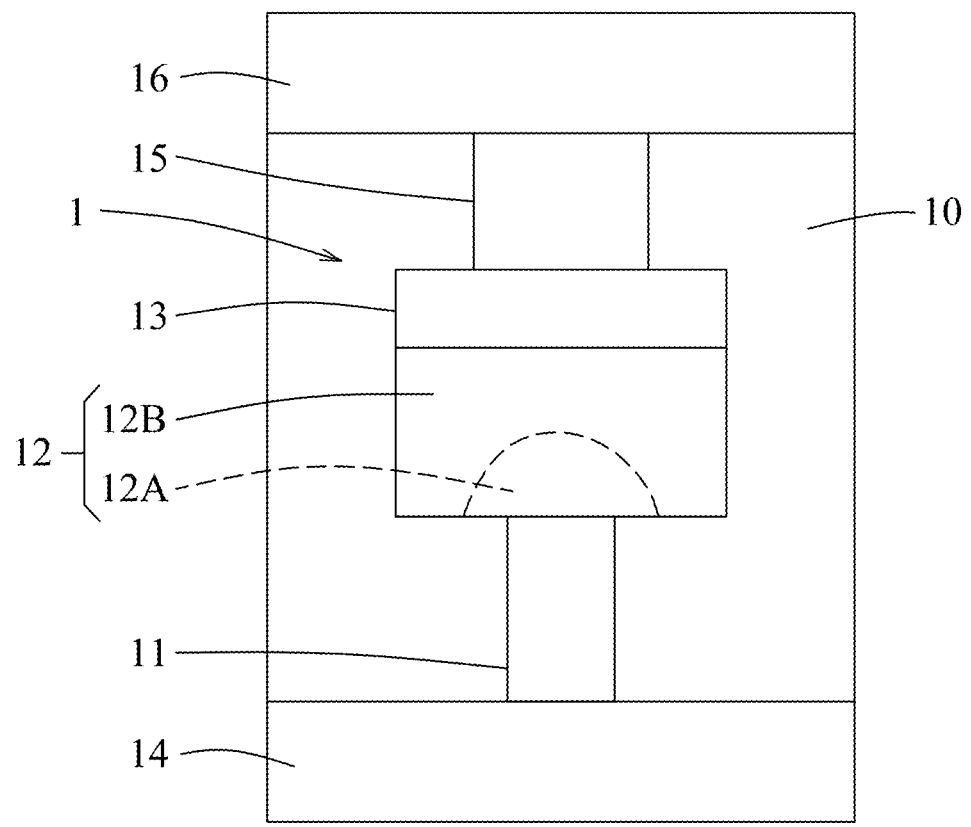
FIG. 15 is a schematic view illustrating a structure of the PCM cell that is in the low-resistance data state in accordance with some embodiments, where the fixed-width step-pulse set is applied to the PCM cell after the fixed-width step-pulse reset.

FIG. 15 illustrates the GST feature 12 after the fixed-width step-pulse set that follows the fixed-width step-pulse reset. The fixed-width step-pulse set transforms the active region 12A of the GST feature 12 from the high-resistivity state into the low-resistivity state. According to the data collected from multiple PCM cells 1 in the illustrative embodiment, a common phenomenon is observed that more than 80% of the active region 12A is crystalized area when the active region 12A has been transformed into the low-resistivity state, and the crystalized area is a mixture of the hexagonal crystal structure and the cubic crystal structure, where the major phase is the hexagonal phase, usually occupying more than 60% of the crystalized area (i.e., more than 60% of the crystalline microstructure in the active region 12A has the hexagonal crystal structure). Such observation proves that the fixed-width step-pulse reset may promote formation of stable hexagonal GST microstructure instead of meta-stable cubic GST microstructure. The smaller volume of the active region 12A and the majority of the hexagonal phase may both contribute to alleviating or eliminating the double hump phenomenon.

Figure 16:
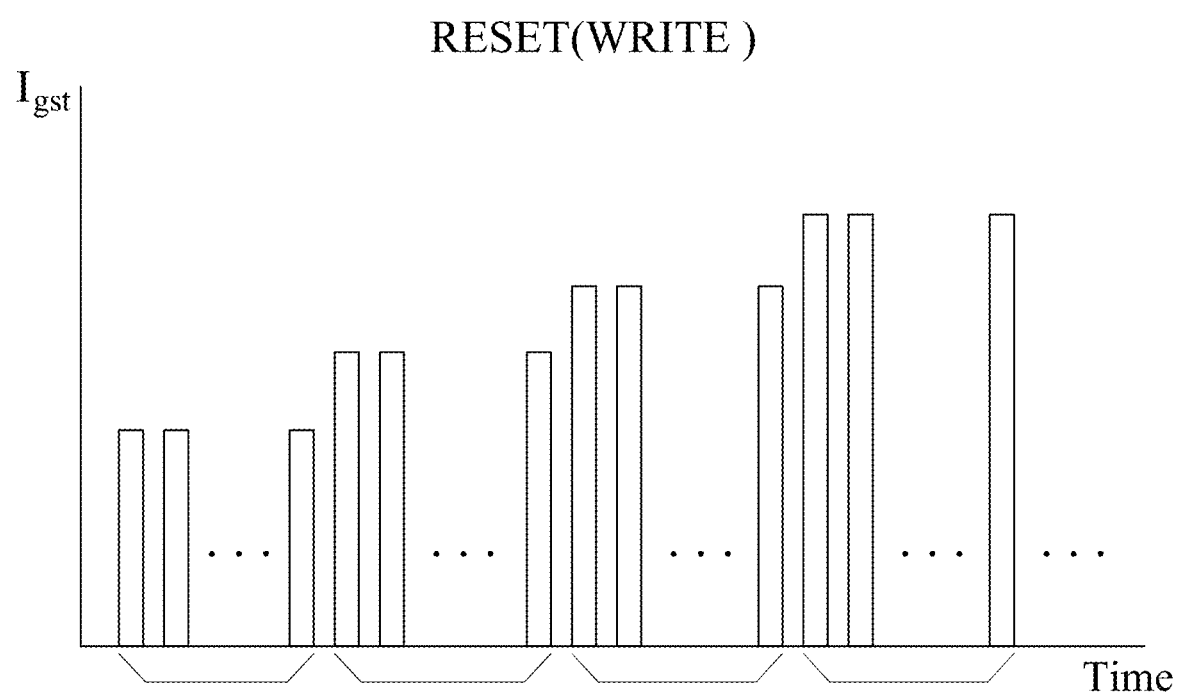
FIG. 16 is a waveform diagram illustrating a variation of the fixed-width step-pulse reset in accordance with some embodiments.

FIG. 16 illustrates a variation of the fixed-width step-pulse reset, where the reset current pulses may be divided into multiple groups, and the reset current pulses in the same group may have the same current amplitude. The reset current pulses in a later group have a greater current amplitude than those in an earlier group. Such a reset scenario may achieve similar effects as introduced with respect to the fixed-width step-pulse reset as shown in FIG. 10.

Referring to FIGS. 1, 2, 17 and 18, in accordance with some embodiments, a method for writing data into the PCM cell 1 is shown to include a reset stage ("RESET") and a set stage ("SET"). In the reset stage, the fixed-width step-pulse reset as described for FIG. 10 is applied to the PCM cell 1 (step S181). In the set stage, multiple set current pulses are applied to the GST feature 12 through the bottom electrode 11 and the top electrode 13 (step S182). The set current pulses demonstrate a gradual increase in current amplitude, and the set stage includes multiple sub-stages that correspond to different pulse widths (i.e., at least two of the sub-stages correspond to different pulse widths); this type of set stage is called "multi-width step-pulse set". In each sub-stage, the set current pulses have the corresponding one of the pulse widths. For example, in the illustrative embodiment, the set stage includes four sub-stages, where the set current pulses in the first sub-stage (SS-1) may have a pulse width of 160 ns, the set current pulses in the second sub-stage (SS-2) may have a pulse width of 100 ns, the set current pulses in the third sub-stage (SS-3) may have a pulse width of 140 ns, and the set current pulses in the fourth sub-stage (SS-4) may have a pulse width of 200 ns. However, this disclosure is not limited to the specific combination of pulse widths and the specific number of sub-stages. In other words, other embodiments may employ different combinations of pulse widths and/or different numbers of sub-stages for achieving a desired effect (e.g., desired slope of the curve of set current pulse vs. cell resistance). In accordance with some embodiments, the pulse width of the set current pulses for each sub-stage may range from about 50 ns to about 500 ns, and a pulse interval between two consecutive set current pulses may range from about 50 ns to about 500 ns. A time period of the set stage (e.g., between the first set current pulse and the last set current pulse) may range from about 20 µs to about 2000 µs. If energy applied to the GST feature 12 at the set stage is insufficient (e.g., resulting from an insufficient pulse width, excessively long pulse interval(s), and/or an insufficient time period of the set stage), the amorphous portion of the GST feature 12 may not be effectively crystalized. If energy applied to the GST feature 12 at the set stage is excessively large (e.g., resulting from an excessively long pulse width, insufficient pulse interval(s), and/or an excessively long time period of the set stage), time required for the write operation may be too long, resulting in poor operation efficiency. Similar to the aforesaid embodiments, the set current pulses usually have smaller current amplitudes and greater pulse widths in comparison to the reset current pulses, so as to enable crystallization in the GST structure 12. The current amplitudes and the pulse widths of the reset and set current pulses may depend on the structure and the material of the PCM cell 1, which should be familiar to those skilled in the art, so details thereof are omitted herein for the sake of brevity. In the right plot of FIG. 17, the decreasing read current pulses at the reset stage show a trend that the resistance of the PCM cell 1 increases with the increasing reset current pulses (see the middle plot of FIG. 17), and the increasing read current pulses at the set stage show a trend that the resistance of the PCM cell 1 decreases with the increasing set current pulses (see the middle plot of FIG. 17).

Figure 17:
FIG. 17 is a waveform diagram illustrating a method for writing data into the PCM cell in accordance with some embodiments, where a multi-width step-pulse set is applied to the PCM cell after a fixed-width step-pulse reset.
Figure 18:
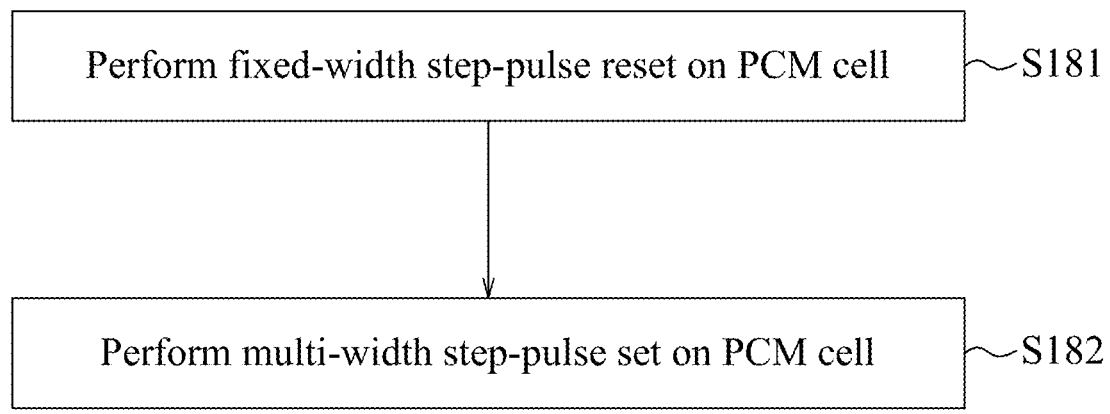
FIG. 18 is a flow chart illustrating steps of a method for writing data into the PCM cell in accordance with some embodiments, where the multi-width step-pulse set is applied to the PCM cell after the fixed-width step-pulse reset.
Figure 19:
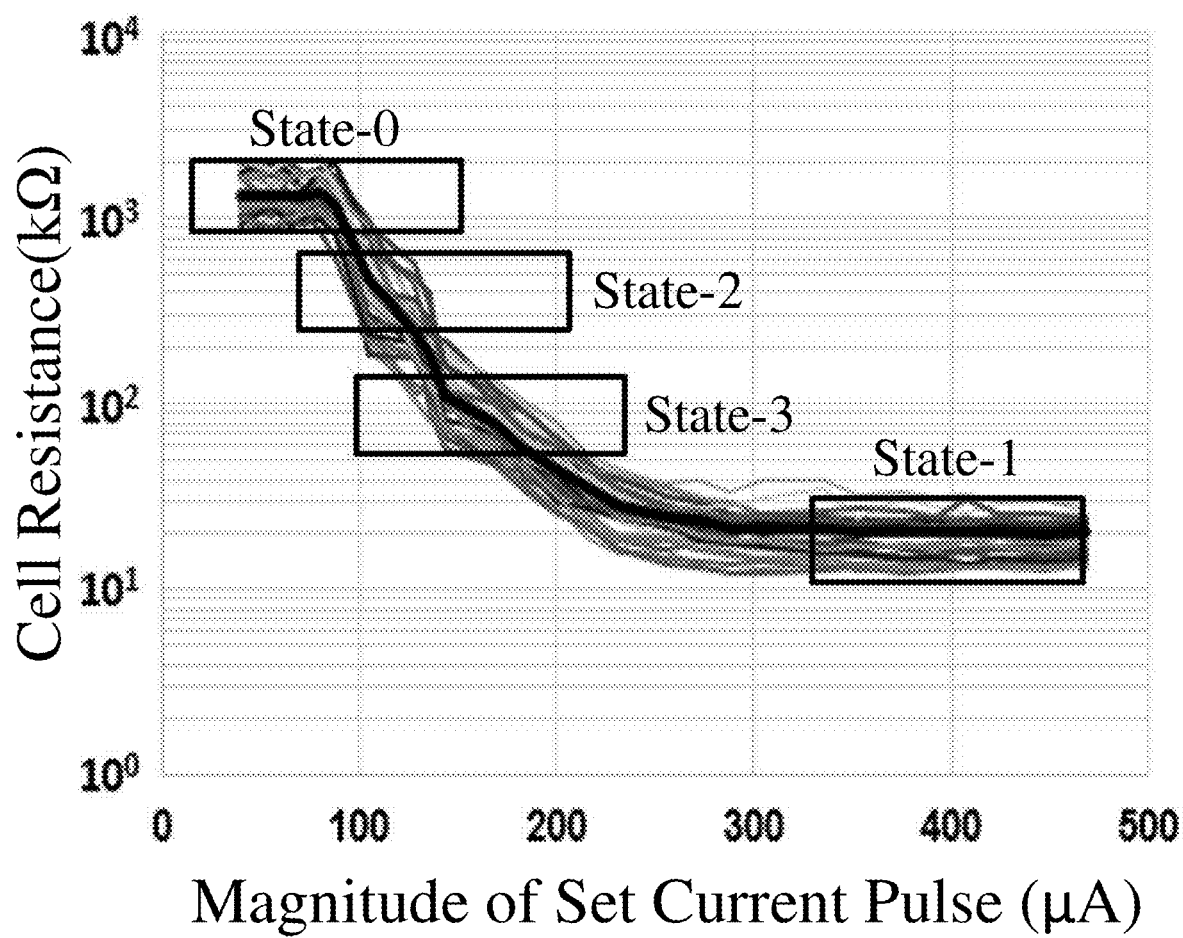
FIG. 19 is a plot illustrating a relationship between a cell resistance of the PCM cell and current amplitudes of set current pulses applied to the PCM cell in accordance with some embodiments, where the multi-width step-pulse set is applied to the PCM cell after the fixed-width step-pulse reset.

FIG. 19 illustrates variation of the cell resistance with the increasing set current pulses by use of the aforesaid operation scenario (i.e., fixed-width step-pulse reset+multi-width step-pulse set, as shown in FIG. 17). Curves in FIG. 19 correspond to multiple PCM cells and show that the cell resistance tends to decrease with the increasing set current pulses, and the double hump phenomenon is absent. In addition, the slope of each of the slope sections of the curves from state-0 to state-1 is about five, which is gentler (less steep) than those in FIG. 12. In the illustrative embodiment, the slope sections of the curves correspond to a cell current range of from about 50 µA to about 350 µA, which is sufficiently wide for MLC application. From the experiments, it is observed that the multi-width step-pulse set contributes to making variation of the cell resistance less sensitive to the change of the cell current in current amplitude.

For MLC application, at least two additional data states should be added between state-0 and state-1, and each of the data states represents a respective data value (e.g., a binary value "00", "01", "10" or "11"). In the illustrative embodiment, state-0 is exemplified to have a central resistance value of 1400 kΩ, state-1 is exemplified to have a central resistance value of 20 kΩ, the first intermediate data state (state-2) is exemplified to have a central resistance value of 400 kΩ, and the second intermediate data state (state-3) is exemplified to have a central resistance value of 100 kΩ. The four data states can thus be used for storage of 2-bit data. Each of the data states may have a tolerance of, e.g., ±50% the central resistance value, so as to avoid misjudgment of the data state resulting from tiny humps of the current-resistance curves. However, this disclosure is not limited to the specific segmentations of resistance values that are used to define the data states. Different segmentations (e.g., different central resistance values and/or different tolerances) may be used in other embodiments due to, for example but not limited to, design requirement, structure of the PCM cells, materials used for the PCM cells, etc. In the illustrative embodiment, the reset current pulses make the PCM cell 1 enter state-0, so the set current pulses may not be required if state-0 is the target data state. If state-1 is the target data state, the set stage that follows the reset stage may include all of the four sub-stages, so that the set current pulses gradually increase to about 400 µA, reducing the cell resistance from about 1400 kΩ to about 20 kΩ. If state-2 is the target data state, the set stage that follows the reset stage may include only the first sub-stage (SS-1) or further include a part of the second sub-stage, so that the set current pulses gradually increase to about 100 µA, reducing the cell resistance from about 1400 kΩ to about 400 kΩ. If state-3 is the target data state, the set stage that follows the reset stage may include only the first sub-stage (SS-1) and the second sub-stage (SS-2) or further include a part of the third sub-stage, so that the set current pulses gradually increase to about 200 µA, reducing the cell resistance from about 1400 kΩ to about 100 kΩ. It is noted that the illustrative embodiment is provided only for ease of explanation, and this disclosure is not limited to such.

The GST feature 12 after the fixed-width step-pulse reset is similar to that described in connection with FIG. 13, so details thereof are not repeated herein for the sake of brevity.

Figure 20:
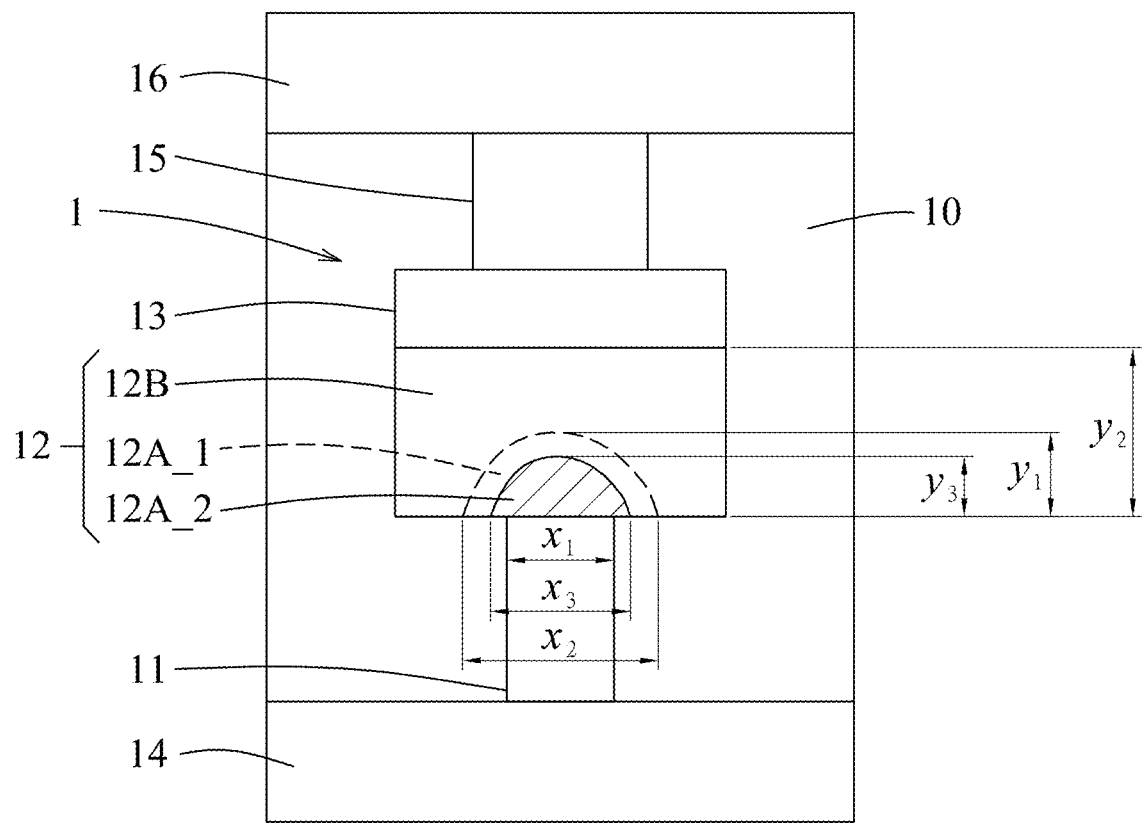
FIG. 20 is a schematic view illustrating a structure of the PCM cell that is in an intermediate data state in accordance with some embodiments, where the multi-width step-pulse set is applied to the PCM cell after the fixed-width step-pulse reset.

FIG. 20 illustrates the GST feature 12 when the PCM cell 1 is at an intermediate data state (e.g., state-2 or state-3, see FIG. 19). The set current pulses to turn the PCM cell 1 into the intermediate data state induce crystallization of an outer portion of the active region 12A, making the outer portion turn into the low-resistivity state. Hereinafter, the outer portion of the active region 12A that has turned into the low-resistivity state is referred to as a low-resistivity portion 12A_1, where a percentage of crystalline microstructure is greater than a percentage of amorphous microstructure, and the remaining portion of the active region 12A is referred to as a high-resistivity portion 12A_2, where a percentage of amorphous microstructure is greater than a percentage of crystalline microstructure. Therefore, the volume of the high-resistivity portion of the active region 12A becomes smaller (when the PCM cell 1 is at state-0, the entire active region 12A is of high resistivity). In other words, the high-resistivity portion 12A_2 of the active region 12A of the PCM cell 1 in the intermediate data state has a smaller width and/or a smaller height than that in state-0 (i.e., the entire active region 12A). According to the data collected from a plurality of the PCM cells 1 in the illustrative embodiment, a common phenomenon is observed that more than 80% of the low-resistivity portion 12A_1 is crystalized area, which is a mixture of the hexagonal crystal structure and the cubic crystal structure, and the major phase of the crystalized area of the low-resistivity portion 12A_1 is the hexagonal phase, usually occupying more than 60% of the crystalized area (i.e., more than 60% of the crystalline microstructure in the low-resistivity portion 12A_1 has a hexagonal crystal structure). On the other hand, more than 80% of the high-resistivity portion 12A_2 is amorphous. It is also observed that, for the intermediate data state, a ratio of a width ($x_3$) of the high-resistivity portion 12A_2 to the width ($x_1$) of the bottom electrode 11 is commonly in a range from about 0.1 to about 2.0 (i.e., $0.1 \leq x_3/x_1 \leq 2.0$), and a ratio of a height ($y_3$) of the high-resistivity portion 12A_2 to the height ($y_2$) of the GST feature 12 is commonly in a range from about 0.05 to about 0.8 (i.e., $0.05 \leq y_3/y_2 \leq 0.8$).

The GST feature 12 after the multi-width step-pulse reset is similar to that described in connection with FIG. 15, so details thereof are not repeated herein for the sake of brevity.

Figure 21:
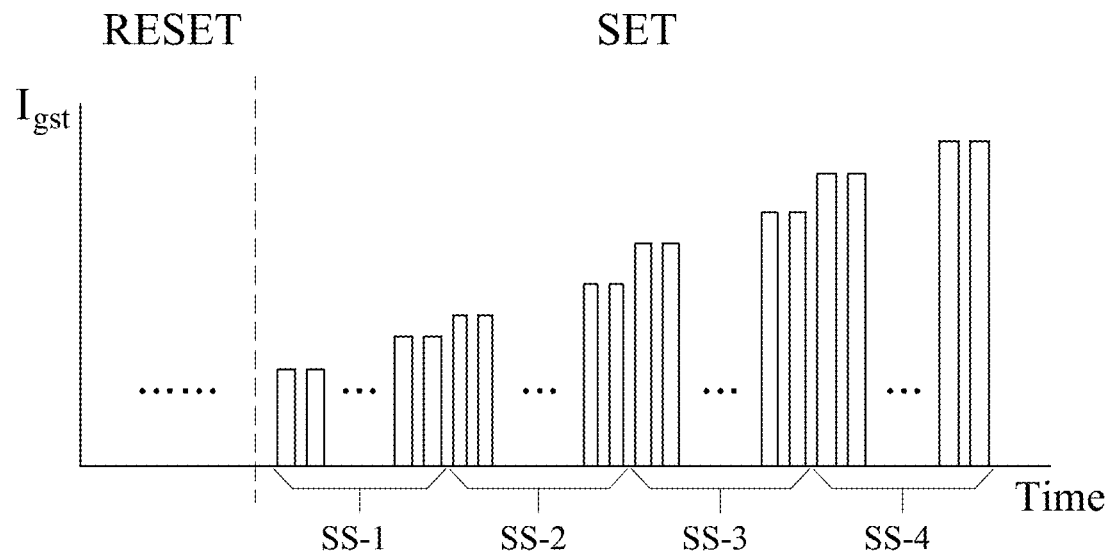
FIG. 21 is a waveform diagram illustrating a variation of the multi-width step-pulse set in accordance with some embodiments.

FIG. 21 illustrates a variation of the multi-width step-pulse set, where, for each sub-stage, the set current pulses may be divided into multiple groups each containing multiple set current pulses, and the set current pulses in the same group may have the same current amplitude. The set current pulses in a later group have a greater current amplitude than those in an earlier group. Such a set scenario may achieve similar effects as introduced for the multi-width step-pulse set as shown in FIG. 17.

Figure 22:
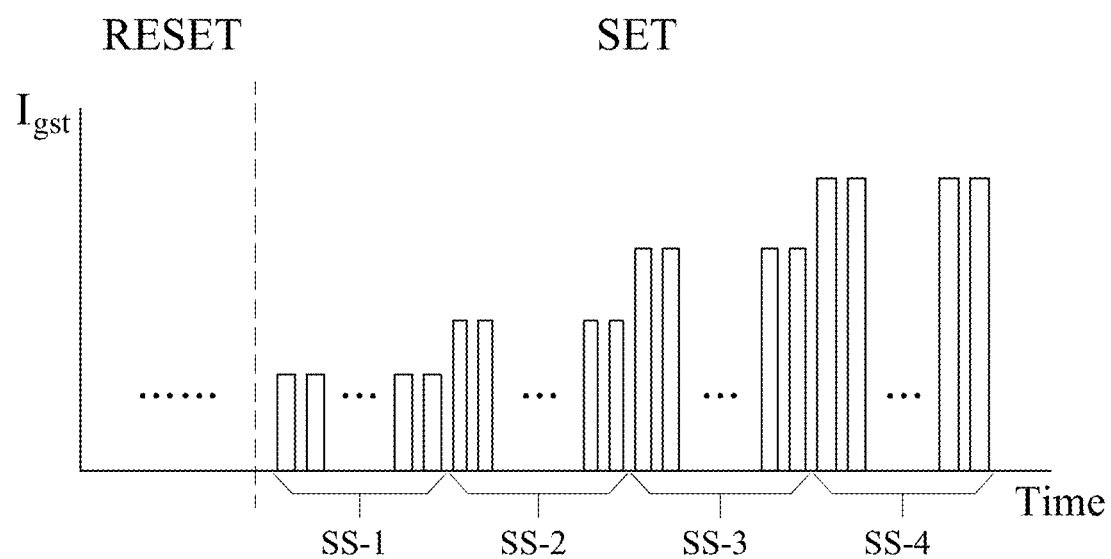
FIG. 22 is a waveform diagram illustrating another variation of the multi-width step-pulse set in accordance with some embodiments.

FIG. 22 illustrates another variation of the multi-width step-pulse set, wherein the sub-stages respectively correspond to different current amplitudes. In other words, for each sub-stage, the set current pulses have not only the same pulse width but also the same current amplitude. The set current pulses at a later sub-stage have a greater current amplitude than those at an earlier sub-stage. Such a set scenario may achieve similar effects as introduced for the multi-width step-pulse set as shown in FIG. 17.

Figure 23:
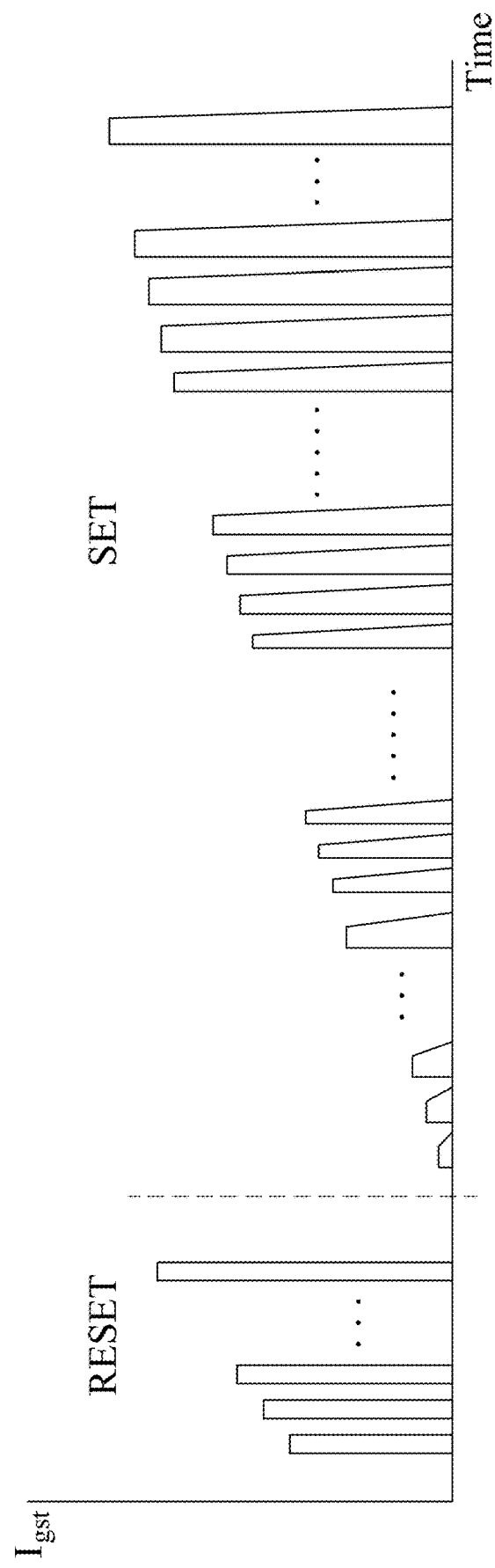
FIG. 23 is a waveform diagram illustrating a difference between the reset current pulses and the set current pulses in accordance with some embodiments.

FIG. 23 exemplarily illustrates that, in accordance with some embodiments, the set current pulses have relatively gentle falling edges in comparison to the reset current pulses. The gentle falling edges may mitigate a temperature drop of the GST feature 12, which is favorable for crystallization of the amorphous portion in the GST feature 12.

It is noted that the plots shown in FIGS. 3, 4, 10, 16, 17, 20, 21 and 22 are intended to illustrate only the increasing trend or decreasing trend of the pulses in amplitude, and do not reflect the amplitudes of the pulses very precisely.

In summary, the embodiments of this disclosure propose to perform write operation on the GST feature 12 with a fixed-width step-pulse reset to avoid the double hump phenomenon from occurring during switching of the GST feature 12 from state-0 to state-1. Furthermore, when the multi-width step-pulse set is also used in the write operation, the cell resistance would become less sensitive to the amplitude variation of the set current pulses, which is favorable for MLC application.

In accordance with some embodiments, a phase-change memory (PCM) cell is provided to include a first electrode, a second electrode, and a phase-change feature that is disposed between the first electrode and the second electrode. The phase-change feature is configured to, based on a write operation performed on the PCM cell, switch among a high-resistance data state, a low-resistance data state and at least one intermediate data state. Each of the high-resistance data state, the low-resistance data state and the at least one intermediate data state represents a respective data value. The write operation includes a reset stage and a set stage that follows the reset stage. In the reset stage, a plurality of reset current pulses are applied to the PCM cell through the first electrode and the second electrode. For consecutive two of the reset current pulses, a later one of the consecutive two of the reset current pulses has a current amplitude not smaller than an earlier one of the consecutive two of the reset current pulses. In the set stage, a plurality of set current pulses are applied to the PCM cell through the first electrode and the second electrode. For consecutive two of the set current pulses, a later one of the consecutive two of the set current pulses has a current amplitude not smaller than an earlier one of the consecutive two of the set current pulses. The set current pulses are smaller than the reset current pulses in current amplitude.

In accordance with some embodiments, the reset current pulses have a fixed pulse width.

In accordance with some embodiments, the pulse width of the reset current pulses ranges from 5 ns to 100 ns.

In accordance with some embodiments, the phase-change feature has an active region adjacent to the second electrode. The reset current pulses transform the phase-change feature into a high-resistance data state where the active region of the phase-change feature is in a high-resistivity state. A percentage of amorphous microstructure is greater than a percentage of crystalline microstructure in the active region when the active region is in the high-resistivity state. A ratio of a width of the active region to a width of the second electrode is in a range from 0.5 to 2.0, and a ratio of a height of the active region to a height of the phase-change feature is a range from 0.2 to 0.8.

In accordance with some embodiments, the phase-change feature is a GST feature that includes germanium, antimony and tellurium, and the set current pulses transform the phase-change feature into a low-resistance data state where the active region of the phase-change feature is in a low-resistivity state. An electrical resistance of the phase-change feature in the low-resistance data state is smaller than that in the high-resistance data state. The percentage of crystalline microstructure is greater than the percentage of amorphous microstructure in the active region when the active region is in the low-resistivity state. More than 60% of the crystalline microstructure in the active region has a hexagonal crystal structure when the active region is in the low-resistivity state.

In accordance with some embodiments, the set stage includes multiple sub-stages each corresponding to one of multiple different pulse widths. For each of the sub-stages, the set current pulses in the sub-stage have the corresponding one of the multiple different pulse widths. At least two of the sub-stages correspond to different ones of the multiple different pulse widths.

In accordance with some embodiments, the pulse widths of the set current pulses range from 50 ns to 500 ns.

In accordance with some embodiments, for at least one of the sub-stages, the set current pulses in the sub-stage have a same current amplitude.

In accordance with some embodiments, for at least one of the sub-stages, the set current pulses in the sub-stage have multiple current amplitudes.

In accordance with some embodiments, the phase-change feature has an active region adjacent to the second electrode. The reset current pulses transform the phase-change feature into a high-resistance data state where the active region of the phase-change feature is in a high-resistivity state. A percentage of amorphous microstructure is greater than a percentage of crystalline microstructure in the active region when the active region is in the high-resistivity state. The phase-change feature is a GST feature that includes germanium, antimony and tellurium, and, when the phase-change feature has been transformed into a low-resistance data state by the set current pulses, the active region of the phase-change feature is in a low-resistivity state, where the percentage of crystalline microstructure is greater than the percentage of amorphous microstructure in the active region. An electrical resistance of the phase-change feature in the low-resistance data state is smaller than that in the high-resistance data state. More than 60% of the crystalline microstructure in the active region has a hexagonal crystal structure when the active region is in the low-resistivity state.

In accordance with some embodiments, when the phase-change feature has been transformed into an intermediate data state by the set current pulses, the active region of the phase-change feature is divided into a low-resistivity portion and a high-resistivity portion. An electrical resistance of the phase-change feature in the intermediate data state is smaller than that in the high-resistance data state, and is greater than that in the low-resistance data state. A percentage of crystalline microstructure is greater than a percentage of amorphous microstructure in the low-resistivity portion, and a percentage of amorphous microstructure is greater than a percentage of crystalline microstructure in the high-resistivity portion. A ratio of a width of the high-resistivity portion to a width of the second electrode is in a range from 0.1 to 2.0, and a ratio of a height of the high-resistivity portion to a height of the phase-change feature is in a range from 0.05 to 0.8.

In accordance with some embodiments, more than 60% of the crystalline microstructure in the low-resistivity portion of the active region has a hexagonal crystal structure.

In accordance with some embodiments, in the set stage, a relationship between an electrical resistance of the phase-change feature and current amplitudes of the set current pulses form a curve that has a slope section with a slope of n, where 2≤n≤5, and n is obtained by using an equation of $R_{SET}=C_0 \times I_{SET}^{-n}+C_1$ to approximate the slope section, where $I_{SET}$ represents the current amplitudes of the set current pulses in μA, $R_{SET}$ represents the electrical resistance of the phase-change feature in kΩ, which results from the set current pulses, and $C_0$ and $C_1$ are constants.

In accordance with some embodiments, a phase-change memory (PCM) cell is provided to include a first electrode, a second electrode, and a phase-change feature that is disposed between the first electrode and the second electrode and that has an active region adjacent to the second electrode. The PCM cell is configured to, based on a write operation performed on the PCM cell, switch among a high-resistance data state, a low-resistance data state and at least one intermediate data state. Each of the high-resistance data state, the low-resistance data state and the at least one intermediate data state represents a respective data value. The write operation includes a reset stage in which a plurality of reset current pulses are applied to the PCM cell, and a set stage which follows the reset stage and in which a plurality of set current pulses are applied to the PCM cell. A cell resistance of the PCM cell in the high-resistance data state is greater than that in the at least one intermediate data state, and the cell resistance of the PCM cell in the at least one intermediate data state is greater than that in the low-resistance data state. When the PCM cell is in the high-resistance data state, the active region of the phase-change feature is in a high-resistivity state where a percentage of amorphous microstructure is greater than a percentage of crystalline microstructure in the active region. When the PCM cell is in the low-resistance data state, the active region of the phase-change feature is in a low-resistivity state where a percentage of crystalline microstructure is greater than a percentage of amorphous microstructure in the active region. When the PCM cell is in the at least one intermediate data state, the active region of the phase-change feature is divided into a high-resistivity portion and a low-resistivity portion. A percentage of crystalline microstructure is greater than a percentage of amorphous microstructure in the low-resistivity portion, a percentage of amorphous microstructure is greater than a percentage of crystalline microstructure in the high-resistivity portion. A relationship between the cell resistance of the PCM cell and current amplitudes of the set current pulses form a curve that has a slope section with a slope of n, where 2≤n≤5, and n is obtained by using an equation of $R_{SET}=C_0 \times I_{SET}^{-n}+C_1$ to approximate the slope section, where $I_{SET}$ represents the current amplitudes of the set current pulses in μA, $R_{SET}$ represents the cell resistance in kΩ, which results from the set current pulses, and $C_0$ and $C_1$ are constants.

In accordance with some embodiments, a ratio of a width of the active region to a width of the second electrode is in a range from 0.5 to 2.0, and a ratio of a height of the active region to a height of the phase-change feature is a range from 0.2 to 0.8.

In accordance with some embodiments, a ratio of a width of the high-resistivity portion to a width of the second electrode is in a range from 0.1 to 2.0, and a ratio of a height of the high-resistivity portion to a height of the phase-change feature is in a range from 0.05 to 0.8.

In accordance with some embodiments, the phase-change feature is a GST feature that includes germanium, antimony and tellurium, and more than 60% of the crystalline microstructure in the active region has a hexagonal crystal structure when the active region is in the low-resistivity state.

In accordance with some embodiments, more than 60% of the crystalline microstructure in the low-resistivity portion of the active region has a hexagonal crystal structure.

In accordance with some embodiments, a method for fabricating a phase-change memory (PCM) cell is provided to have a first electrode formed, a phase-change feature formed over the first electrode, and a second electrode formed over the phase-change feature. The phase-change feature is to be turned into a high-resistance data state when a plurality of reset current pulses are applied to the PCM cell through the first electrode and the second electrode. The phase-change feature is to be turned from the high-resistance data state into a low-resistance data state when a plurality of set current pulses are applied to the PCM cell through the first electrode and the second electrode. An electrical resistance of the phase-change feature in the high-resistance data state is greater than that in the low-resistance data state.

In accordance with some embodiments, a part of the set current pulses has a pulse width that is different from that of another part of the set current pulses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase-change memory (PCM) cell, comprising a first electrode, a second electrode, and a phase-change feature that is disposed between the first electrode and the second electrode, wherein the phase-change feature is configured to switch between multiple data states based on a write operation performed on the PCM cell,
    wherein the write operation includes a reset stage, and a set stage following the reset stage,
    wherein the phase-change feature has an active region adjacent to the first electrode, and an inactive region separating the active region from the second electrode,
    wherein the active region has a microstructure varying in response to the write operation, and less than 20% of the active region is crystalized after the reset stage and before the set stage, and
    wherein more than 80% of the inactive region has a hexagonal crystal structure after the reset stage and before the set stage.

2. The PCM cell according to claim 1, wherein the active region satisfies at least one of a first dimensional condition or a second dimensional condition, where the first dimensional condition is that a ratio of a width of the active region to a width of the first electrode is in a range from 0.5 to 2.0, and the second dimensional condition is that a ratio of a height of the active region to a height of the phase-change feature is in a range from 0.2 to 0.8.

3. The PCM cell according to claim 2, wherein the active region satisfies both of the first dimensional condition and the second dimensional condition.

4. The PCM cell according to claim 1, wherein the multiple data states include a high-resistance data state, and a low-resistance data state where the phase-change feature has a lower electrical resistance than in the high-resistance data state,
    wherein the percentage of the crystalline microstructure is greater than the percentage of the amorphous microstructure in the active region when the phase-change feature is in the low-resistance data state, and
    wherein more than 60% of the crystalline microstructure in the active region has a hexagonal crystal structure when the phase-change feature is in the low-resistance data state.

5. The PCM cell according to claim 4, wherein the percentage of amorphous microstructure is greater than the percentage of crystalline microstructure in the active region when the phase-change feature is in the high-resistance data state.

6. The PCM cell according to claim 1, wherein the multiple data states include a high-resistance data state, an intermediate data state, and a low-resistance data state, each of which represents a respective data value,
    wherein the phase-change feature has an electrical resistance that is lower in the intermediate data state than in the high-resistance data state,
    wherein the electrical resistance of the phase-change feature is lower in the low-resistance data state than in the intermediate data state,
    wherein the active region of the phase-change feature has a low-resistivity portion and a high-resistivity portion when the phase-change feature is in the intermediate data state, the low-resistivity portion separating the high-resistivity portion from the inactive region of the phase-change feature, and
    wherein a percentage of crystalline microstructure is greater than a percentage of amorphous microstructure in the low-resistivity portion, and a percentage of amorphous microstructure is greater than a percentage of crystalline microstructure in the high-resistivity portion.

7. The PCM cell according to claim 6, wherein a ratio of a width of the high-resistivity portion to a width of the first electrode is in a range from 0.1 to 2.0, and a ratio of a height of the high-resistivity portion to a height of the phase-change feature is in a range from 0.05 to 0.8.

8. The PCM cell according to claim 6, wherein the low-resistivity portion surrounds the high-resistivity portion.

9. The PCM cell according to claim 6, wherein more than 60% of the crystalline microstructure in the low-resistivity portion of the active region has a hexagonal crystal structure.

10. The PCM cell according to claim 1,
    wherein, in the reset stage, the phase-change feature is switched to the high-resistance data state by applying a plurality of reset current pulses to the phase-change feature through the first electrode and the second electrode, and
    wherein current amplitudes of the reset current pulses correspond to at least two different predetermined reset current amplitudes, and the current amplitudes of the reset current pulses monotonically increase over time.

11. The PCM cell according to claim 10, wherein, in the set stage, a plurality of set current pulses are applied to the phase-change feature through the first electrode and the second electrode, and
    wherein current amplitudes of the set current pulses correspond to at least two different predetermined set current amplitudes, and the current amplitudes of the set current pulses monotonically increase over time.

12. The PCM cell according to claim 11, wherein the set stage includes multiple sub-stages that occur sequentially,
    wherein at least two of the sub-stages correspond to different pulse widths, and
    wherein each of the sub-stages includes at least two of the set current pulses, and said at least two of the set current pulses have a same pulse width.

13. The PCM cell according to claim 12, wherein one of said at least two of the set current pulses in one of said at least two of the sub-stages is different from one of said at least two of the set current pulses in another one of said at least two of the sub-stages in terms of current amplitude.

14. The PCM cell according to claim 10, wherein, in the set stage, a plurality of set current pulses are applied to the phase-change feature through the first electrode and the second electrode, and
    wherein a relationship between an electrical resistance of the phase-change feature and current amplitudes of the set current pulses form a curve that has a slope section with a slope of n, where $2 \leq n \leq 5$, and n is obtained by using an equation of $R_{SET}=C_0\times I_{SET}^{-n}+C_1$ to approximate the slope section, where $I_{SET}$ represents the current amplitudes of the set current pulses in μA, $R_{SET}$ represents the electrical resistance of the phase-change feature in kΩ, which results from the set current pulses, and $C_0$ and $C_1$ are constants.

15. A phase-change memory (PCM) cell comprising a first electrode, a second electrode, and a phase-change feature disposed between the first electrode and the second electrode,
    wherein the PCM cell is configured to switch between multiple data states based on a write operation performed on the PCM cell,
    wherein the write operation includes a reset stage, and a set stage following the reset stage,
    wherein, in the set stage, a plurality of set current pulses are applied to the PCM cell,
    wherein the phase-change feature has an active region adjacent to the first electrode, and an inactive region separating the active region from the second electrode,
    wherein the active region of the phase-change feature has a microstructure that varies in response to the write operation, and less than 20% of the active region is crystalized after the reset stage and before the set stage,
    wherein more than 80% of the inactive region has a hexagonal crystal structure after the reset stage and before the set stage, and
    wherein a relationship between a cell resistance of the PCM cell and current amplitudes of the set current pulses form a curve that has a slope section with a slope of n, where $2\leq n\leq 5$, and n is obtained by using an equation of $R_{SET}=C_0\times I_{SET}^{-n}+C_1$ to approximate the slope section, where $I_{SET}$ represents the current amplitudes of the set current pulses in μA, $R_{SET}$ represents the cell resistance in kΩ, which results from the set current pulses, and $C_0$ and $C_1$ are constants.

16. The PCM cell according to claim 15, wherein the phase-change feature has an active region adjacent to the first electrode, and the active region has a microstructure that varies in response to the write operation, and
    wherein the active region satisfies at least one of a first dimensional condition or a second dimensional condition, where the first dimensional condition is that a ratio of a width of the active region to a width of the first electrode is in a range from 0.5 to 2.0, and the second dimensional condition is that a ratio of a height of the active region to a height of the phase-change feature is in a range from 0.2 to 0.8.

17. The PCM cell according to claim 15, wherein the multiple data states include a high-resistance data state, an intermediate data state, and a low-resistance data state, each of which represents a respective data value,
    wherein the cell resistance of the PCM cell in the high-resistance data state is greater than the cell resistance of the PCM cell in the intermediate data state, and the cell resistance of the PCM cell in the intermediate data state is greater than the cell resistance of the PCM cell in the low-resistance data state,
    wherein the active region of the phase-change feature has a low-resistivity portion and a high-resistivity portion when the PCM cell is in the intermediate data state, and the low-resistivity portion surrounds the high-resistivity portion, and
    wherein a percentage of crystalline microstructure is greater than a percentage of amorphous microstructure in the low-resistivity portion, and a percentage of amorphous microstructure is greater than a percentage of crystalline microstructure in the high-resistivity portion.

18. The PCM cell according to claim 17, wherein the high-resistivity portion satisfies at least one of a first dimensional condition or a second dimensional condition, and
    wherein the first dimensional condition is that a ratio of a width of the high-resistivity portion to a width of the first electrode is in a range from 0.1 to 2.0, and the second dimensional condition is that a ratio of a height of the high-resistivity portion to a height of the phase-change feature is in a range from 0.05 to 0.8.

19. The PCM cell according to claim 18, wherein more than 60% of the crystalline microstructure in the low-resistivity portion of the active region has a hexagonal crystal structure.

20. A phase-change memory (PCM) cell, comprising a first electrode, a second electrode, and a phase-change feature that is disposed between the first electrode and the second electrode, wherein the phase-change feature is configured to switch between multiple data states based on a write operation performed on the PCM cell,
    wherein the write operation includes a reset stage in which a plurality of reset current pulses are applied to the PCM cell through the first electrode and the second electrode, and a set stage which follows the reset stage and in which a plurality of set current pulses are applied to the PCM cell through the first electrode and the second electrode,
    wherein the set stage includes multiple sub-stages that occur sequentially,
    wherein at least two of the sub-stages correspond to different pulse widths, and
    wherein each of the sub-stages includes at least two of the set current pulses, and said at least two of the set current pulses have a same pulse width.

* * * * *